United States Patent
Salcedo et al.

(10) Patent No.: US 11,784,488 B2
(45) Date of Patent: Oct. 10, 2023

(54) ELECTRICAL OVERSTRESS PROTECTION WITH LOW LEAKAGE CURRENT FOR HIGH VOLTAGE TOLERANT HIGH SPEED INTERFACES

(71) Applicant: Analog Devices International Unlimited Company, Limerick (IE)

(72) Inventors: Javier A. Salcedo, North Billerica, MA (US); Srivatsan Parthasarathy, Acton, MA (US); Enrique C. Bosch, Alginet (ES)

(73) Assignee: Analog Devices International Unlimited Company, Co. Limerick (IE)

( * ) Notice: Subject to any disclaimer, the term of this patent is extended or adjusted under 35 U.S.C. 154(b) by 0 days.

(21) Appl. No.: 17/810,112

(22) Filed: Jun. 30, 2022

(65) Prior Publication Data

US 2022/0337055 A1 Oct. 20, 2022

Related U.S. Application Data

(62) Division of application No. 16/291,352, filed on Mar. 4, 2019, now Pat. No. 11,387,648.
(Continued)

(51) Int. Cl.
*H02H 9/04* (2006.01)
*H01L 29/739* (2006.01)
(Continued)

(52) U.S. Cl.
CPC .......... *H02H 9/046* (2013.01); *H01L 27/0255* (2013.01); *H01L 27/0262* (2013.01);
(Continued)

(58) Field of Classification Search
CPC .................. H02H 9/046; H01L 27/0248–0296
See application file for complete search history.

(56) References Cited

U.S. PATENT DOCUMENTS 3,436,667 A 4/1969 Kedson
4,331,884 A 5/1982 Svedberg
(Continued)

FOREIGN PATENT DOCUMENTS

CN 1438704 A 8/2003
CN 101273507 A 9/2008
(Continued)

OTHER PUBLICATIONS

Chang et al., "High-k Metal Gate-bounded Silicon Controlled Rectifier for ESD Protection" Electrical Overstress / Electrostatic Discharge Symposium Proceedings 2012, in 7 pages.
(Continued)

*Primary Examiner* — Jared Fureman
*Assistant Examiner* — Christopher J Clark
(74) *Attorney, Agent, or Firm* — Knobbe, Martens, Olson & Bear, LLP

(57) ABSTRACT

Electrical overstress protection for high speed interfaces are disclosed. In certain embodiments, a semiconductor die with bidirectional protection against electrical overstress is provided. The semiconductor die includes a first pad, a second pad, a forward protection silicon controlled rectifier (SCR) electrically connected between the first pad and the second pad and configured to activate in response to electrical overstress that increases a voltage of the first pad relative to a voltage of the second pad, and a reverse protection SCR electrically connected in parallel with the forward protection SCR between the first pad and the second pad and config-
(Continued)

ured to activate in response to electrical overstress that decreases the voltage of the first pad relative to the voltage of the second pad.

20 Claims, 25 Drawing Sheets

Related U.S. Application Data

(60) Provisional application No. 62/790,822, filed on Jan. 10, 2019.

(51) Int. Cl.
 *H01L 29/08* (2006.01)
 *H02H 11/00* (2006.01)
 *H01L 27/02* (2006.01)

(52) U.S. Cl.
 CPC ...... *H01L 29/0834* (2013.01); *H01L 29/0839* (2013.01); *H01L 29/7391* (2013.01); *H02H 11/002* (2013.01)

(56) References Cited

U.S. PATENT DOCUMENTS

| | | |
|---|---|---|
| 4,633,283 A | 12/1986 | Avery |
| 5,061,652 A | 10/1991 | Bendernagel et al. |
| 5,276,582 A | 1/1994 | Merrill et al. |
| 5,341,005 A | 8/1994 | Canclini |
| 5,343,053 A | 8/1994 | Avery |
| 5,369,041 A | 11/1994 | Duvvury |
| 5,400,202 A | 3/1995 | Metz et al. |
| 5,436,786 A | 7/1995 | Pelly et al. |
| 5,541,801 A | 7/1996 | Lee et al. |
| 5,576,557 A | 11/1996 | Ker et al. |
| 5,615,074 A | 3/1997 | Avery |
| 5,652,689 A | 7/1997 | Yuan |
| 5,663,860 A | 9/1997 | Swonger |
| 5,682,047 A | 10/1997 | Consiglio et al. |
| 5,719,733 A | 2/1998 | Wei et al. |
| 5,742,084 A | 4/1998 | Yu |
| 5,745,323 A | 4/1998 | English et al. |
| 5,748,425 A | 5/1998 | Gutsch et al. |
| 5,781,389 A | 7/1998 | Fukuzako et al. |
| 5,786,617 A | 7/1998 | Merrill et al. |
| 5,835,328 A | 11/1998 | Maloney et al. |
| 5,852,540 A | 12/1998 | Haider |
| 5,870,268 A | 2/1999 | Lin et al. |
| 5,889,644 A | 3/1999 | Schoenfeld et al. |
| 5,895,840 A | 4/1999 | Ohuchi et al. |
| 5,895,940 A | 4/1999 | Kim |
| 5,973,341 A | 10/1999 | Letavic et al. |
| 5,978,192 A | 11/1999 | Young et al. |
| 5,998,813 A | 12/1999 | Bernier |
| 6,097,068 A | 8/2000 | Brown et al. |
| 6,104,589 A | 8/2000 | Williamson |
| 6,137,140 A | 10/2000 | Efland et al. |
| 6,144,542 A | 11/2000 | Ker et al. |
| 6,172,403 B1 | 1/2001 | Chen |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,369,994 B1 | 4/2002 | Voldman |
| 6,403,992 B1 | 6/2002 | Wei |
| 6,404,261 B1 | 6/2002 | Grover et al. |
| 6,423,987 B1 | 7/2002 | Constapel et al. |
| 6,429,489 B1 | 8/2002 | Botula et al. |
| 6,442,008 B1 | 8/2002 | Anderson |
| 6,512,662 B1 | 1/2003 | Wang |
| 6,538,266 B2 | 3/2003 | Lee et al. |
| 6,590,273 B2 | 7/2003 | Okawa et al. |
| 6,614,633 B1 | 9/2003 | Kohno |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,784,489 B1 | 8/2004 | Menegoli |
| 6,798,629 B1 | 9/2004 | Proebsting |
| 6,828,842 B2 | 12/2004 | Saito et al. |
| 6,861,680 B2 | 3/2005 | Ker et al. |
| 6,870,202 B2 | 3/2005 | Oka |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,064,393 B2 | 6/2006 | Mergens et al. |
| 7,071,528 B2 | 7/2006 | Ker et al. |
| 7,102,862 B1 | 9/2006 | Lien et al. |
| 7,106,563 B2 | 9/2006 | Lai et al. |
| 7,125,760 B1 | 10/2006 | Reese et al. |
| 7,232,705 B2 | 6/2007 | Righter |
| 7,232,711 B2 | 6/2007 | Gambino et al. |
| 7,285,828 B2 | 10/2007 | Salcedo et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,545,614 B2 | 6/2009 | Traynor et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,706,113 B1 | 4/2010 | Lien et al. |
| 7,714,357 B2 | 5/2010 | Hayashi et al. |
| 7,738,222 B2 | 6/2010 | Deutschmann et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,217,461 B1 | 7/2012 | Chu et al. |
| 8,218,276 B2 | 7/2012 | Mallikarjunaswamy |
| 8,222,698 B2 | 7/2012 | Salcedo et al. |
| 8,248,741 B2 | 8/2012 | Barrow |
| 8,320,091 B2 | 11/2012 | Salcedo et al. |
| 8,331,069 B2 | 12/2012 | Galy et al. |
| 8,345,394 B2 | 1/2013 | Zhao et al. |
| 8,368,116 B2 | 2/2013 | Salcedo et al. |
| 8,416,543 B2 | 4/2013 | Salcedo |
| 8,422,187 B2 | 4/2013 | Parthasarathy et al. |
| 8,432,651 B2 | 4/2013 | Salcedo et al. |
| 8,462,477 B2 | 6/2013 | Modica et al. |
| 8,466,489 B2 | 6/2013 | Salcedo et al. |
| 8,553,380 B2 | 10/2013 | Salcedo |
| 8,564,065 B2 | 10/2013 | Donovan et al. |
| 8,582,261 B2 | 11/2013 | Salcedo et al. |
| 8,592,860 B2 | 11/2013 | Salcedo et al. |
| 8,610,251 B1 | 12/2013 | Salcedo |
| 8,633,509 B2 | 1/2014 | Salcedo et al. |
| 8,637,899 B2 | 1/2014 | Salcedo |
| 8,649,134 B2 | 2/2014 | Smith |
| 8,665,570 B2 | 3/2014 | Jalilizeinali et al. |
| 8,665,571 B2 | 3/2014 | Salcedo et al. |
| 8,680,620 B2 | 3/2014 | Salcedo et al. |
| 8,686,470 B2 | 4/2014 | Ritter |
| 8,723,227 B2 | 5/2014 | Salcedo et al. |
| 8,730,630 B2 | 5/2014 | Parthasarathy et al. |
| 8,759,871 B2 | 6/2014 | Song et al. |
| 8,772,091 B2 | 7/2014 | Salcedo et al. |
| 8,773,826 B2 | 7/2014 | Althlaguirre et al. |
| 8,796,729 B2 | 8/2014 | Clarke et al. |
| 8,829,570 B2 | 9/2014 | Salcedo et al. |
| 8,860,080 B2 | 10/2014 | Salcedo |
| 8,890,248 B2 | 11/2014 | Pauletti et al. |
| 8,946,822 B2 | 2/2015 | Salcedo et al. |
| 8,947,841 B2 | 2/2015 | Salcedo et al. |
| 8,958,187 B2 | 2/2015 | Parthasarathy et al. |

(56) References Cited

U.S. PATENT DOCUMENTS

| | | |
|---|---|---|
| 8,963,200 B2 | 2/2015 | Lee et al. |
| 9,006,781 B2 | 4/2015 | Salcedo et al. |
| 9,013,845 B1 | 4/2015 | Karp |
| 9,088,256 B2 | 7/2015 | Cosgrave et al. |
| 9,123,540 B2 | 9/2015 | Salcedo et al. |
| 9,147,677 B2 | 9/2015 | Salcedo et al. |
| 9,171,832 B2 | 10/2015 | Salcedo et al. |
| 9,184,098 B2 | 11/2015 | Salcedo et al. |
| 9,275,991 B2 | 3/2016 | Salcedo et al. |
| 9,293,912 B2 | 3/2016 | Parthasarathy et al. |
| 9,368,485 B1 | 6/2016 | Chu |
| 9,391,062 B2 * | 7/2016 | Davis ................ H01L 27/0262 |
| 9,450,402 B1 | 9/2016 | Huang et al. |
| 9,478,608 B2 | 10/2016 | Salcedo et al. |
| 9,634,482 B2 | 4/2017 | Parthasarathy et al. |
| 9,831,233 B2 | 11/2017 | Salcedo et al. |
| 10,158,029 B2 | 12/2018 | Parthasarathy et al. |
| 10,177,566 B2 | 1/2019 | Zhao et al. |
| 10,199,369 B2 | 2/2019 | Parthasarathy et al. |
| 10,249,609 B2 | 4/2019 | Salcedo et al. |
| 10,734,806 B2 | 8/2020 | Zhao et al. |
| 10,861,845 B2 | 12/2020 | Salcedo et al. |
| 11,387,648 B2 | 7/2022 | Salcedo et al. |
| 2001/0040254 A1 | 11/2001 | Takiguchi |
| 2002/0021538 A1 | 2/2002 | Chen et al. |
| 2002/0075619 A1 * | 6/2002 | Maytum ................ H04M 3/18 |
| | | 361/91.1 |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0043523 A1 | 3/2003 | Hung et al. |
| 2003/0076636 A1 | 4/2003 | Ker et al. |
| 2003/0201457 A1 | 10/2003 | Lin et al. |
| 2003/0214769 A1 | 11/2003 | Nishikawa et al. |
| 2004/0114288 A1 | 6/2004 | Cheng et al. |
| 2004/0135229 A1 | 7/2004 | Sasahara |
| 2004/0164351 A1 | 8/2004 | Petruzzello et al. |
| 2004/0164354 A1 | 8/2004 | Mergens et al. |
| 2004/0164356 A1 | 8/2004 | Josef Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0133869 A1 | 6/2005 | Ker et al. |
| 2005/0151160 A1 | 7/2005 | Salcedo et al. |
| 2005/0173727 A1 | 8/2005 | Manna et al. |
| 2005/0195540 A1 | 9/2005 | Streibl et al. |
| 2005/0269641 A1 | 12/2005 | Lai et al. |
| 2005/0286188 A1 | 12/2005 | Camp et al. |
| 2006/0033163 A1 | 2/2006 | Chen |
| 2006/0050452 A1 | 3/2006 | Oguzman et al. |
| 2006/0103998 A1 | 5/2006 | Smith |
| 2006/0109595 A1 | 5/2006 | Watanabe et al. |
| 2006/0145260 A1 | 7/2006 | Kim |
| 2006/0151836 A1 | 7/2006 | Salcedo et al. |
| 2006/0186467 A1 | 8/2006 | Pendharkar et al. |
| 2006/0285418 A1 | 12/2006 | Aoki |
| 2007/0007545 A1 | 1/2007 | Salcedo et al. |
| 2007/0058307 A1 | 3/2007 | Mergens et al. |
| 2007/0076338 A1 | 4/2007 | Traynor et al. |
| 2007/0158748 A1 | 7/2007 | Chu et al. |
| 2007/0195472 A1 | 8/2007 | Kwak et al. |
| 2007/0267701 A1 | 11/2007 | Sung et al. |
| 2008/0044955 A1 | 2/2008 | Salcedo et al. |
| 2008/0067601 A1 | 3/2008 | Chen |
| 2008/0106837 A1 | 5/2008 | Jang |
| 2008/0203534 A1 | 8/2008 | Xu et al. |
| 2008/0247102 A1 | 10/2008 | Vinson |
| 2008/0304191 A1 | 12/2008 | Riviere et al. |
| 2008/0316659 A1 | 12/2008 | Oguzman et al. |
| 2009/0032838 A1 | 2/2009 | Tseng et al. |
| 2009/0034137 A1 | 2/2009 | Disney et al. |
| 2009/0045457 A1 | 2/2009 | Bobde |
| 2009/0057715 A1 | 3/2009 | Ryu et al. |
| 2009/0122452 A1 | 5/2009 | Okushima |
| 2009/0140802 A1 | 6/2009 | Kitagawa et al. |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0148797 A1 | 6/2010 | Ker et al. |
| 2010/0149701 A1 | 6/2010 | Drapkin et al. |
| 2010/0163973 A1 | 7/2010 | Nakamura et al. |
| 2010/0214704 A1 | 8/2010 | Lamey et al. |
| 2010/0214706 A1 | 8/2010 | Crespo et al. |
| 2010/0321841 A1 | 12/2010 | Worley et al. |
| 2010/0327343 A1 | 12/2010 | Salcedo et al. |
| 2010/0328827 A1 | 12/2010 | Lai et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0198678 A1 | 8/2011 | Ker et al. |
| 2011/0207409 A1 | 8/2011 | Ker et al. |
| 2011/0222196 A1 | 9/2011 | Smith |
| 2011/0235228 A1 | 9/2011 | Salcedo et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0002333 A1 | 1/2012 | Soldner et al. |
| 2012/0002337 A1 | 1/2012 | Parthasarathy et al. |
| 2012/0007207 A1 | 1/2012 | Salcedo |
| 2012/0008242 A1 | 1/2012 | Salcedo |
| 2012/0057260 A1 | 3/2012 | Poulton |
| 2012/0176708 A1 | 7/2012 | Tsai |
| 2012/0180008 A1 | 7/2012 | Gist et al. |
| 2012/0199874 A1 | 8/2012 | Salcedo et al. |
| 2012/0205714 A1 | 8/2012 | Salcedo et al. |
| 2012/0211869 A1 | 8/2012 | Lee et al. |
| 2012/0257317 A1 | 10/2012 | Abou-Khalil et al. |
| 2012/0293904 A1 | 11/2012 | Salcedo et al. |
| 2012/0320483 A1 | 12/2012 | Salcedo et al. |
| 2013/0032882 A1 | 2/2013 | Salcedo et al. |
| 2013/0155558 A1 | 6/2013 | Bourgeat et al. |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0078624 A1 | 3/2014 | Nagamatsu et al. |
| 2014/0133055 A1 | 5/2014 | Parthasarathy et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |
| 2014/0168831 A1 | 6/2014 | Watanabe |
| 2014/0185168 A1 | 7/2014 | Kunz, Jr. et al. |
| 2014/0285932 A1 | 9/2014 | Miyamoto et al. |
| 2014/0339601 A1 | 11/2014 | Salcedo et al. |
| 2014/0346563 A1 | 11/2014 | Salcedo et al. |
| 2014/0355157 A1 | 12/2014 | Huang et al. |
| 2015/0076557 A1 | 3/2015 | Salcedo et al. |
| 2015/0229125 A1 | 8/2015 | Kato et al. |
| 2015/0263505 A1 | 9/2015 | Takada |
| 2015/0270258 A1 | 9/2015 | Dabral et al. |
| 2015/0276854 A1 | 10/2015 | Cejka et al. |
| 2015/0311700 A1 | 10/2015 | Lee |
| 2016/0020603 A1 | 1/2016 | Parthasarathy et al. |
| 2016/0087429 A1 | 3/2016 | Wang et al. |
| 2016/0140075 A1 | 5/2016 | Kashyap et al. |
| 2016/0204096 A1 | 7/2016 | Zhao et al. |
| 2016/0261110 A1 | 9/2016 | Ivanov et al. |
| 2016/0285255 A1 | 9/2016 | O'Donnell et al. |
| 2016/0300830 A1 * | 10/2016 | Salcedo ............ H01L 27/0262 |
| 2016/0336740 A1 | 11/2016 | Parthasarathy et al. |
| 2016/0336744 A1 | 11/2016 | Parthasarathy et al. |
| 2017/0243862 A1 | 8/2017 | Parthasarathy et al. |

(56) References Cited

U.S. PATENT DOCUMENTS

| | | |
|---|---|---|
| 2017/0256534 A1 | 9/2017 | Parthasarathy et al. |
| 2017/0317070 A1 | 11/2017 | Salcedo et al. |
| 2017/0366002 A1 | 12/2017 | Zhao et al. |
| 2018/0006448 A1 | 1/2018 | Glaser et al. |
| 2018/0026440 A1 | 1/2018 | Zhao et al. |
| 2018/0158814 A1 | 6/2018 | Salcedo et al. |
| 2018/0159323 A1 | 6/2018 | Huang et al. |
| 2018/0211951 A1 | 7/2018 | Luo et al. |
| 2018/0226788 A1 | 8/2018 | Salcedo et al. |
| 2018/0287378 A1* | 10/2018 | Sithanandam ...... H01L 29/7835 |
| 2019/0131787 A1 | 5/2019 | He et al. |
| 2020/0227914 A1 | 7/2020 | Salcedo et al. |
| 2020/0343721 A1 | 10/2020 | Parthasarathy et al. |

FOREIGN PATENT DOCUMENTS

| | | |
|---|---|---|
| CN | 101297451 A | 10/2008 |
| CN | 101626154 A | 1/2010 |
| CN | 101707368 A | 5/2010 |
| CN | 201536104 U | 7/2010 |
| CN | 102118024 A | 7/2011 |
| CN | 103219720 A | 7/2013 |
| CN | 103248033 A | 8/2013 |
| CN | 103401229 A | 11/2013 |
| CN | 103795026 A | 5/2014 |
| CN | 203607843 U | 5/2014 |
| CN | 103839941 | 6/2014 |
| CN | 103915828 A | 7/2014 |
| CN | 104283201 A | 1/2015 |
| CN | 104753055 | 7/2015 |
| EP | 1617477 A1 | 1/2006 |
| EP | 1048078 B1 | 5/2010 |
| TW | 577166 B | 2/2004 |
| WO | WO 03/063203 A2 | 7/2003 |
| WO | WO 2009/050641 | 4/2009 |
| WO | WO 2012/003114 A1 | 1/2012 |
| WO | WO 2014/180184 A1 | 11/2014 |
| WO | WO 2017/078676 A1 | 5/2017 |

OTHER PUBLICATIONS

International Search Report and Written Opinion for International Application No. PCT/EP2020/050205 dated Jul. 7, 2020 in 18 pages.

Invitation to Pay Additional Fees Notice for International Application No. PCT/EP2020/050205 dated Mar. 16, 2020, in 136 pages.

Ker et al., "ESD protection design for CMOS RF integrated circuits using polysilicon diodes" Microelectronics Reliability 42(6):863-872, Jun. 2002, in 10 pages.

Ker et al., "SCR Device With Double-Triggered Technique for On-Chip ESD Protection in Sub-Quarter-Micron Silicided CMOS Processes" IEEE Transactions on Device and Materials Reliability, vol. 3, Issue 3, Sep. 2003, in 11 pages.

Salcedo et al., Electrostatic Discharge Protection Framework for Mixed-Signal High Voltage CMOS Applications. 9th International Conference on Solid-State and Integrated-Circuit Technology, Oct. 2008. 4 pages.

Salcedo et al., Monolithic ESD Protection for Distributed High Speed Applications in 28-nm CMOS Technology, IEEE 2014, 4 pages.

Zhang et al., "A Full-Chip ESD Protection Circuit Simulation and Fast Dynamic Checking Method Using SPICE and ESD Behavior Models" IEEE Transactions on Computer-Aided Design of Integrated Circuits and Systems, vol. 38, Issue 3, Mar. 2019 in 10 pages.

\* cited by examiner

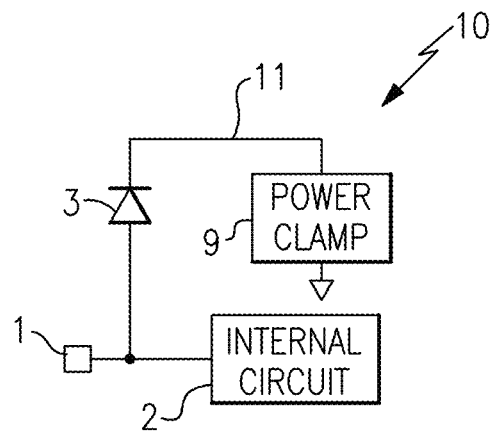
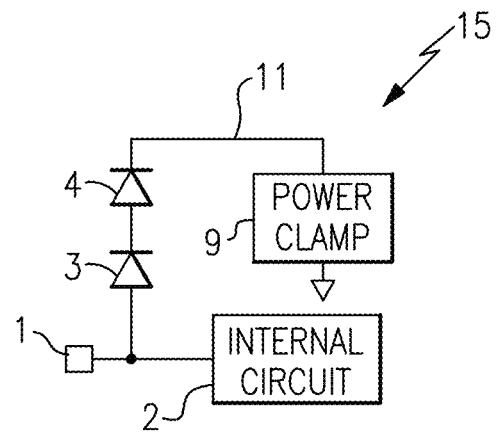
FIG.1A        FIG.1B
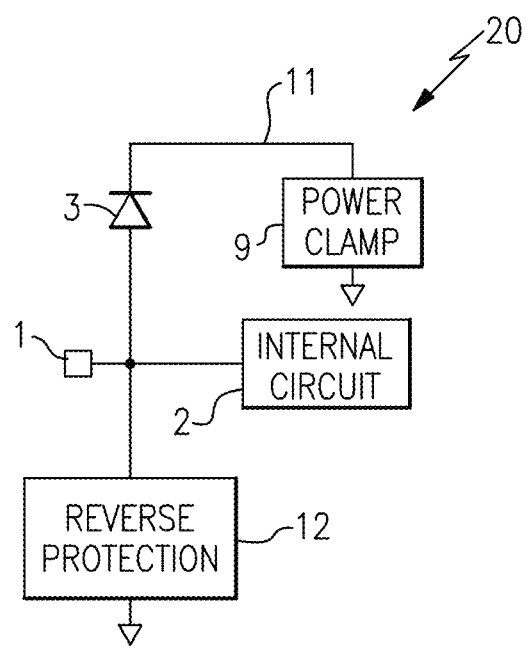
FIG.1C

ELECTRICAL OVERSTRESS PROTECTION WITH LOW LEAKAGE CURRENT FOR HIGH VOLTAGE TOLERANT HIGH SPEED INTERFACES

CROSS-REFERENCE TO RELATED APPLICATIONS

The present application is a divisional of U.S. patent application Ser. No. 16/291,352, filed Mar. 4, 2019, and titled "ELECTRICAL OVERSTRESS PROTECTION WITH LOW LEAKAGE CURRENT FOR HIGH VOLTAGE TOLERANT HIGH SPEED INTERFACES," which claims priority to U.S. Provisional Patent Application No. 62/790,822, filed Jan. 10, 2019, and titled "ELECTRICAL OVERSTRESS PROTECTION WITH LOW LEAKAGE CURRENT AND LOW CAPACITANCE," each of which is hereby incorporated herein by reference in their entireties.

FIELD OF THE DISCLOSURE

Embodiments of the invention relate to electronic systems, and more particularly to low leakage, low capacitance, and/or high voltage tolerant electrical overstress protection.

BACKGROUND

Certain electronic systems can be exposed to electrical overstress events, or electrical signals of short duration having rapidly changing voltage and high power. Electrical overstress events include, for example, electrical overstress (EOS) and electrostatic discharge (ESD) arising from the abrupt release of charge from an object or person to an electronic system.

Electrical overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY OF THE DISCLOSURE

Electrical overstress protection with low leakage current and low capacitance is provided. In certain embodiments, a semiconductor chip includes a power clamp for protecting against electrical overstress at a pad of the chip's electrical interface. The power clamp is isolated from the pad by at least one isolation blocking voltage device. By interposing the isolation blocking voltage device between the pad and the power clamp, the pad is shielded from a capacitance of the power clamp and/or an amount of leakage current at the pad is reduced. Thus, the electrical interface can operate with high speed, rapid signaling, and/or low static power dissipation while maintaining robustness in the presence of electrical overstress that could otherwise damage the semiconductor chip.

In one aspect, a semiconductor die with low leakage current and high voltage tolerant electrical overstress protection is provided. The semiconductor die includes a signal pad, an internal circuit electrically connected to the signal pad, a power clamp electrically connected to an isolated node, and one or more isolation blocking voltage devices electrically connected between the signal pad and the isolated node. The one or more isolation blocking voltage devices are operable to isolate the signal pad from a capacitance of the power clamp.

In another aspect, an electrical interface for a semiconductor chip is provided. The electrical interface includes a signal pad, an internal circuit electrically connected to the signal pad, a power clamp electrically connected to an isolated node, and means for isolating the signal pad from a capacitance of the power clamp. The means for isolating is electrically connected between the signal pad and the isolated node.

In another aspect, a method of providing electrical overstress protection with low capacitance and low leakage current is provided. The method includes receiving an electrical overstress event at a signal pad of a semiconductor die, discharging the electrical overstress event using a power clamp that is electrically connected to an isolated node, and isolating the signal pad from a capacitance of the power clamp using at least one isolation blocking voltage device interposed between the signal pad and the isolated node.

In another aspect, a semiconductor die with bidirectional protection against electrical overstress is provided. The semiconductor die includes a first pad, a second pad, a forward protection SCR electrically connected between the first pad and the second pad and configured to activate in response to electrical overstress that increases a voltage of the first pad relative to a voltage of the second pad, and a reverse protection SCR electrically connected in parallel with the forward protection SCR between the first pad and the second pad and configured to activate in response to electrical overstress that decreases the voltage of the first pad relative to the voltage of the second pad. In certain embodiments, at least one of the forward protection SCR or the reverse protection SCR includes one or more gated diodes.

BRIEF DESCRIPTION OF THE DRAWINGS

FIG. 1A is a schematic diagram of a chip interface according to one embodiment.

FIG. 1B is a schematic diagram of a chip interface according to another embodiment.

FIG. 1C is a schematic diagram of a chip interface according to another embodiment.

DETAILED DESCRIPTION

Figure 1D:
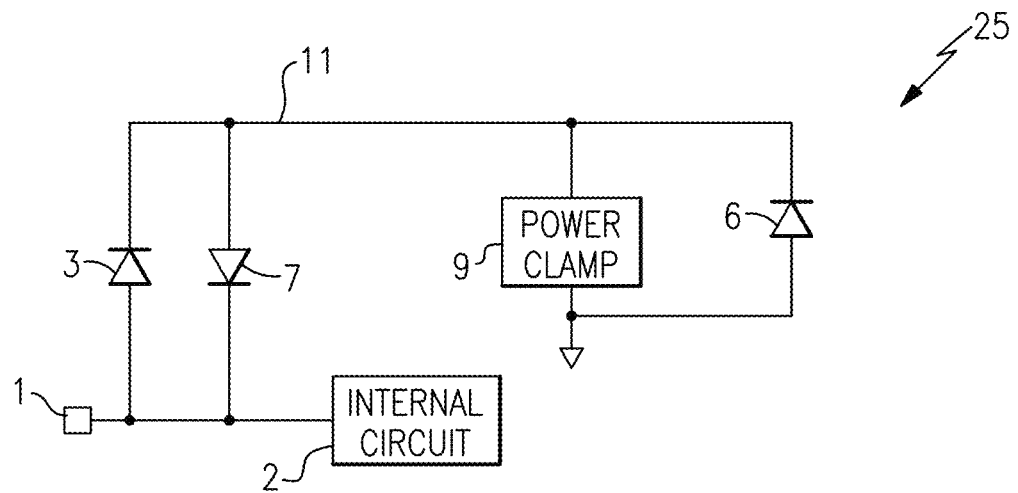
FIG. 1D is a schematic diagram of a chip interface according to another embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain electronic systems include overstress protection circuits to protect circuits or components from electrical overstress events. To help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of electrical overstress events, including electrical overstress (EOS) and/or electrostatic discharge (ESD).

Power Clamp Isolated from Pad by One or More Isolation Blocking Voltage Devices

Electrical overstress protection with low leakage current and low capacitance is provided. In certain embodiments, a semiconductor chip includes a power clamp for protecting against electrical overstress at a pad of the chip's electrical interface. The power clamp is isolated from the pad by at least one isolation blocking voltage device. By interposing the isolation blocking voltage device between the pad and the power clamp, the pad is shielded from a capacitance of the power clamp and/or an amount of leakage current at the pad is reduced. Thus, the electrical interface can operate with high speed, rapid signaling, and/or low static power dissipation while maintaining robustness in the presence of electrical overstress that could otherwise damage the semiconductor chip.

Such electrical overstress protection schemes are suitable for a wide range of pads, including, but not limited to, pads operating with tight constraints on leakage current and/or capacitance. For example, the teachings herein can be used to provide protection to a consumer electronics control (CEC) pad of a high-definition multimedia interface (HDMI).

Examples of isolation blocking voltage devices include, but are not limited to, isolation diodes, isolation thyristors, and/or other devices that exhibit little to no conduction below a blocking voltage while conducting at voltages above the blocking voltage.

FIG. 1A is a schematic diagram of a chip interface 10 according to one embodiment. The chip interface 10 includes a chip pin or pad 1, an internal circuit 2, an isolation diode 3, and a power clamp 9. The chip interface 10 corresponds to a portion of an electrical interface for a semiconductor die or chip.

In the illustrated embodiment, the isolation diode 3 has been included to aid in reducing the impacts of parasitic capacitance of the power clamp 9 on operation of the internal circuit 2. As shown in FIG. 1A, the isolation diode 3 is electrically connected in series with the power clamp 9 between the pad 1 and a reference voltage, such as ground. In certain implementations, the reference voltage is connected to another pad of the chip, such as a ground pad.

Although an embodiment with an isolation diode is shown, the teachings herein are applicable to other types of isolation blocking voltage devices. For example, isolation diodes, isolation thyristors, and/or other isolation blocking voltage devices can be used. Moreover, the teachings herein are applicable to implementations using a combination of two or more isolation blocking voltage devices of different types. For example, one or more isolation diodes can be electrically connected in series with one or more isolation thyristors between a signal pad and an isolated node.

The power clamp 9 provides electrical overstress protection to the internal circuit 2. For example, the power clamp 9 activates to provide forward protection when electrical overstress causes the voltage of the pad 1 to increase (relative to the reference voltage) to reach a trigger voltage. Although not depicted in FIG. 1A, in certain implementations, the chip interface 10 further includes reverse protection circuitry for protecting against electrical overstress that causes the voltage of the pad 1 to decrease relative to the reference voltage.

The node between the power clamp 9 and the isolation diode 3 corresponds to an isolated node 11 that is not directly connected to a pad or pin of the semiconductor die. Rather, the isolated node 11 is electrically isolated from the pad 1 by the isolation diode 3 and electrically isolated from the reference voltage (for instance, in implementations in which the reference voltage is provided by a ground pad) by the power clamp 9. The isolated node 11 is also referred to herein as a virtual supply.

Certain electrical overstress protection circuits exhibit a relatively large amount of snapback, corresponding to a difference between a trigger voltage of the protection circuit and a holding voltage of the protection circuit. Protection circuits with large amounts of snapback can have certain desirable characteristics, but may be unsuitable for certain applications. For example, the large amount of snapback and/or low holding voltage of such protection circuits may be unacceptable for providing protection to certain types of internal circuits and/or pads.

Not only does including the isolation diode 3 shield or isolate the internal circuit 2 from a parasitic capacitance of the power clamp 9, but the isolation diode 3 also increases a holding voltage for overstress protection, thereby enabling a greater range of protection circuits to be suitable for protecting the internal circuit 2. The isolation diode 3 can also aid in reducing leakage current of the power clamp 9, thereby enhancing performance.

In certain implementations, the isolation diode 3 is implemented as a gated diode. For example, a gated diode can include a p-type region (for instance, a P+ region) formed in a semiconductor region (for instance, a p-type or n-type semiconductor well) and an n-type region (for instance, an N+ region) formed in the semiconductor region. Additionally, a field plate or gate (for instance, a metal gate of a field effect transistor) is included between the p-type region and the n-type region over a surface of the semiconductor region. A diode with a gate is referred to herein as a gated diode.

Implementing the isolation diode 3 using a gated diode provides a number of advantages, such as increased control over low capacitance characteristics in the presence of process, temperature, and/or voltage (PVT) variation.

FIG. 1B is a schematic diagram of a chip interface 15 according to another embodiment. The chip interface 15 of FIG. 1B is similar to the chip interface 10 of FIG. 1A, except that the chip interface 15 further includes a second isolation diode 4 in series with the first isolation diode 3.

In certain implementations, two or more isolation diodes are included in series with a power clamp. Including two or more isolation diodes can provide further reductions in parasitic capacitance and/or leakage current. Furthermore, including two or more isolation diodes can increase holding voltage for overstress protection and/or reduce the adverse impacts of snapback of the power clamp 9. Although an example with two isolation diodes is shown, three or more isolation diodes can be included in series.

FIG. 1C is a schematic diagram of a chip interface 20 according to another embodiment. The chip interface 20 of FIG. 1C is similar to the chip interface 10 of FIG. 1A, except that the chip interface 20 further includes a reverse protection circuit 12. As shown in FIG. 1C, the reverse protection circuit 12 is electrically connected between the pad 1 and a reference voltage, such as ground.

The reference voltage of the reverse protection circuit 12 can be the same or different as the reference voltage of the power clamp 9. For instance, in one example, the reference voltage of the reverse protection circuit 12 and the reference voltage of the power clamp 9 are provided by a common pad, such as a shared ground pad. In another example, the reference voltage of the reverse protection circuit 12 and the reference voltage of the power clamp 9 are provided by separate pads. In implementations using separate pads, the reference voltages can be of the same voltage level or of different voltage levels.

In certain implementations, a reverse protection circuit is included to provide protection against electrical overstress that decreases a voltage of the pad. Examples of reverse protection circuits include, but are not limited to, diodes and/or silicon controlled rectifiers (SCRs). An SCR is also referred to herein as a thyristor.

FIG. 1D is a schematic diagram of a chip interface 25 according to another embodiment. The chip interface 25 of FIG. 1D is similar to the chip interface 10 of FIG. 1A, except that the chip interface 25 further includes a first reverse protection diode 6 and a second reverse protection diode 7.

As shown in FIG. 1D, the first reverse protection diode 6 is electrically connected in parallel with the power clamp 9, with an anode of the first reverse protection diode 6 electrically connected to the reference voltage and a cathode of the first reverse protection diode 6 electrically connected to the isolated node 11. Additionally, the second reverse protection diode 7 is electrically connected in series with the first reverse protection diode 6, with an anode of the second reverse protection diode 7 electrically connected to the isolated node 11 and a cathode of the second reverse protection diode 7 electrically connected to the pad 1.

The chip interface 25 of FIG. 1D illustrates another embodiment of electrical overstress protection circuitry that is bidirectional. For example, when a negative polarity electrical overstress event causes the voltage of the pad 1 to decrease relative to the reference voltage, current conducts through the first reverse protection diode 6 and the second reverse protection diode 7 to alleviate the electrical overstress.

Figure 1E:
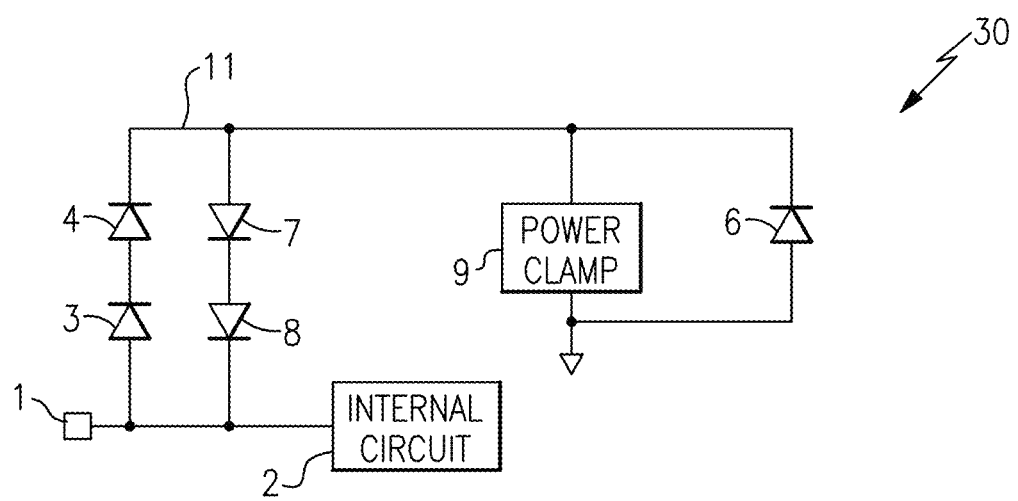
FIG. 1E is a schematic diagram of a chip interface according to another embodiment.

FIG. 1E is a schematic diagram of a chip interface 30 according to another embodiment. The chip interface 30 of FIG. 1E is similar to the chip interface 15 of FIG. 1B, except that the chip interface 30 further includes a first reverse protection diode 6, a second reverse protection diode 7, and a third reverse protection diode 8.

As shown in FIG. 1E, the first reverse protection diode 6, the second reverse protection diode 7, and the third reverse protection diode 8 are electrically connected in series between the reference voltage and the pad 1. Although an example with three diodes in series is shown, more or fewer reverse protection diodes can be included.

The chip interface 30 of FIG. 1E illustrates another embodiment of electrical overstress protection circuitry that is bidirectional.

Figure 2A:
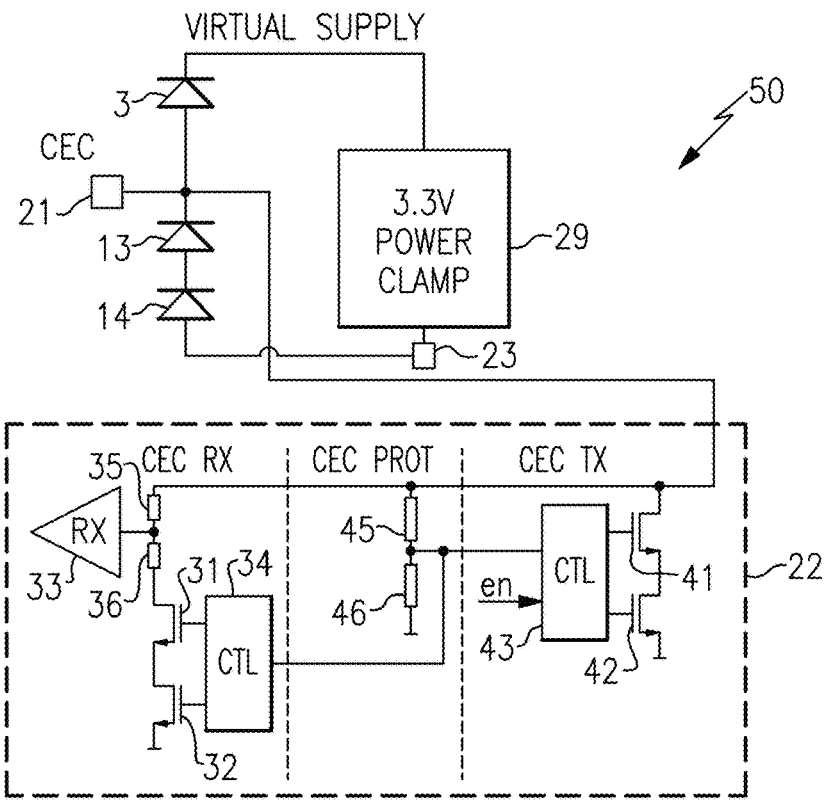
FIG. 2A is a schematic diagram of a chip interface according to another embodiment.

FIG. 2A is a schematic diagram of a chip interface 50 according to another embodiment. The chip interface 50 includes a signal pad 21 (a CEC pin of an HDMI interface, in this example), a ground pad 23, an isolation diode 3, a first reverse protection diode 13, a second reverse protection diode 14, a power clamp 29 (with a trigger voltage of about 3.3 V, in this example), and an internal circuit 22.

The chip interface 50 includes a reverse protection circuit implemented as the first reverse protection diode 13 and the second reverse protection diode 14 in series between the signal pad 21 and the ground pad 23. Although one example of a reverse protection circuit is shown, other implementations of reverse protection are possible. Furthermore, although an example with two reverse protection diodes is depicted, more or fewer reverse protection diodes can be included.

In the illustrated embodiment, the internal circuit 22 includes a CEC receive portion (CEC RX) including a first receive n-type field effect transistor (NFET) 31, a second receive NFET 32, a receiver 33, a receive protect and control circuit 34, a first receive resistor 35, and a second receive resistor 36. As shown in FIG. 2A, the receive protect and control circuit 34 controls the gate voltages of the first receive NFET 31 and the second receive NFET 32.

The internal circuit 22 further includes a CEC transmit portion (CEC TX) including a first transmit NFET 41, a second transmit NFET 42, and a transmit protect and control circuit 43. As shown in FIG. 2A, the transmit protect and control circuit 43 receives an enable signal (en) and controls the gate voltages of the first transmit NFET 41 and the second transmit NFET 42. The internal circuit 22 further includes a CEC protect portion (CEC PROT) including a first sense resistor 45 and a second sense resistor 46, which operate as a voltage divider that provides a divided voltage to the receive protect and control circuit 34 and the transmit protect and control circuit 43. The divided voltage changes in relation to the voltage of the signal pad 21.

Figure 2B:
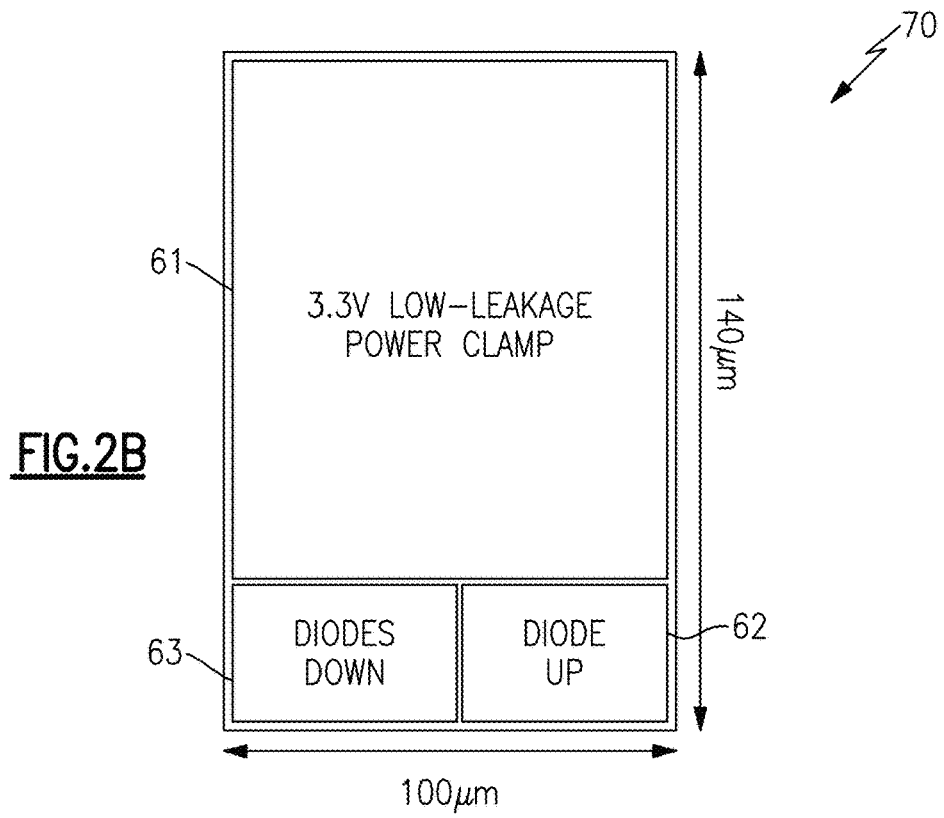
FIG. 2B is a plan view of one embodiment of a layout for a protection circuit.

FIG. 2B is a plan view of one embodiment of a layout 70 for a protection circuit. The layout 70 corresponds to one implementation of the protection circuit layout for the electrical interface 50 of FIG. 2A. The layout includes a low-leakage power clamp section 61 (corresponding to a layout of the power clamp 29), an up diode section 62 (corresponding to a layout of the isolation diode 3), and a diodes down section 63 (corresponding to a layout of the first reverse protection diode 13 and the second reverse protection diode 14). In this example, the layout 70 has a footprint of about 100 μm by 140 μm.

Figure 3A:
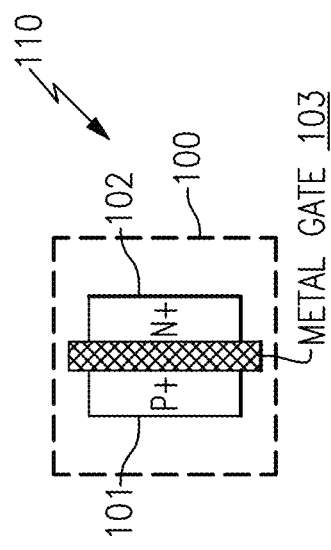
FIG. 3A is a plan view of one embodiment of a layout for a gated diode.

FIG. 3A is a plan view of one embodiment of a layout for a gated diode 110.

The gated diode 110 includes a semiconductor region 100, which can correspond to a doped well or substrate. When the semiconductor region 100 has a p-type doping, the gated diode 110 is referred to as a p-type gated diode. Additionally, when the semiconductor region 100 has an n-type doping, the gated diode 110 is referred to as an n-type gated diode.

With continuing reference to FIG. 3A, the gated diode 110 further includes a P+ anode region 101, an N+ cathode region 102, and a metal gate 103 extending over the semiconductor region 100 between the P+ anode region 101 and the N+ cathode region 102.

Implementing an isolation diode (for instance the first isolation diode 3 and/or the second isolation diode 4 of FIGS. 1A-2A) using a gated diode provides a number of advantages, such as reduced leakage current, lower parasitic capacitance, and/or higher holding voltage. Furthermore, a gated diode can have superior low capacitance characteristics in the presence of PVT variation. In certain implementations herein, the gate of a gated diode is electrically floating during operation.

Figure 3B:
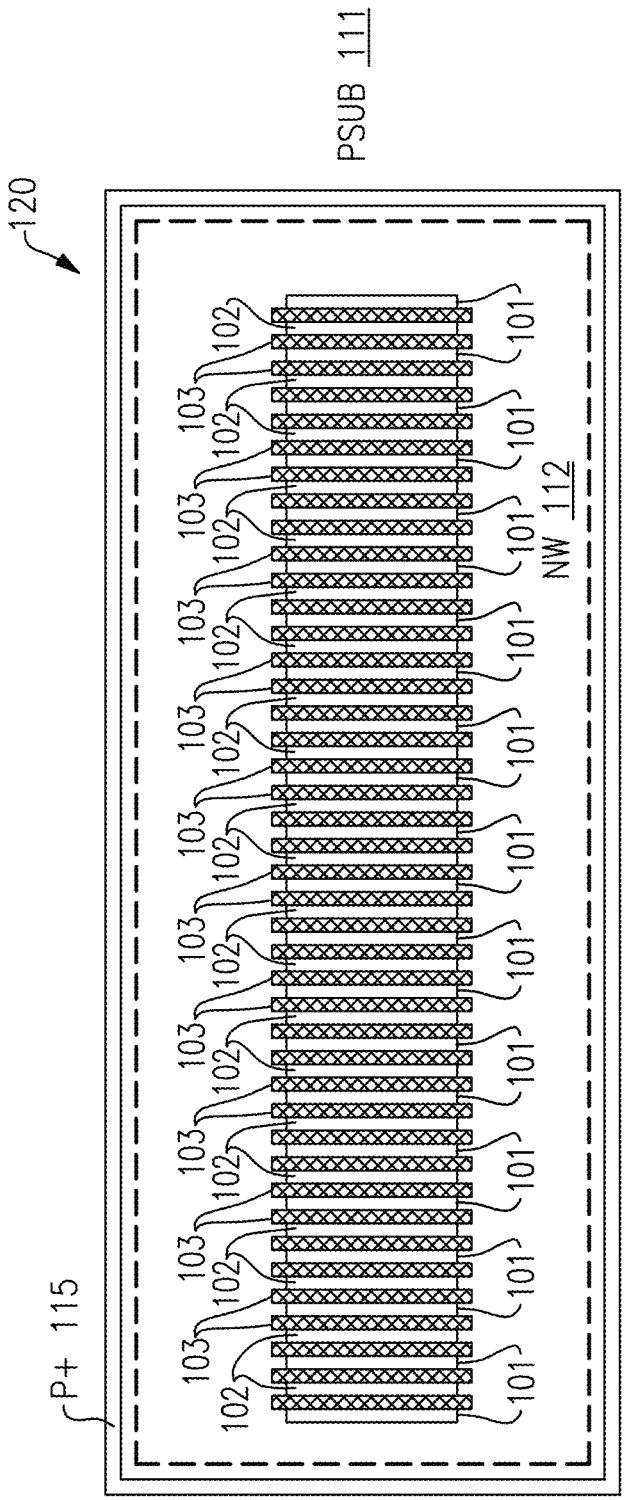
FIG. 3B is a plan view of another embodiment of a layout for a gated diode.

FIG. 3B is a plan view of another embodiment of a layout for a gated diode 120. The gated diode 120 includes P+ anode regions 101, N+ cathode regions 102, metal gates 103, n-type well (NW) 112, and P+ ring 115. The gated diode 120 is fabricated in a p-type substrate (PSUB) 111, in this example.

As shown in FIG. 3B, the P+ anode regions 101 and the N+ cathode regions 102 are formed in the NW 112. Thus, the gated diode 120 of FIG. 3B is an n-type gated diode. The P+ anode regions 101 can be electrically connected to one another using metallization (for instance, metallization associated with backend processing of a semiconductor die) to form an anode terminal of the gated diode 120. Additionally, N+ cathode regions 102 can be electrically connected to one another using metallization to form a cathode terminal of the gated diode 120.

In the illustrated embodiment, the gated diode 120 includes multiple sections or legs that are electrically connected together using metallization. Implementing the gated diode 120 using multiple sections aids in achieving a compact area and/or desired operating characteristics, such as current handling capability.

Figure 3C:
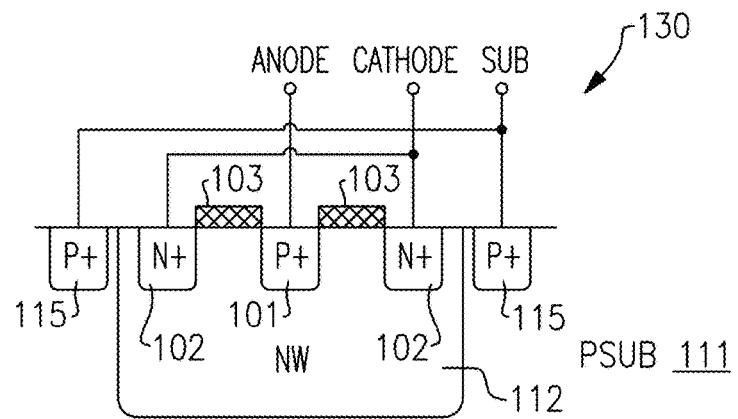
FIG. 3C is a cross section of a gated diode according to another embodiment.

FIG. 3C is a cross section of a gated diode 130 according to another embodiment. The gated diode 130 is formed in the PSUB 111, and includes P+ anode region 101, N+ cathode regions 102, metal gates 103, NW 112, and P+ guard ring 115.

In FIG. 3C, a cross section of the gated diode 130 is depicted. When viewed from above, the gated diode 130 can have a layout implemented in a wide variety of ways, such as a planar layout configuration or annular configuration. For instance, the gated diode 130 can be implemented using a planar layout configuration in accordance with FIG. 3B.

In the illustrated embodiment, the gated diode 130 is formed directly in the PSUB 111. However, the teachings herein are applicable to other configurations, such as implementations in which a substrate includes a p-type epitaxial layer over a doped or undoped support substrate, and the gated diode 130 is fabricated in the p-type epitaxial layer. Although not illustrated in FIG. 3B, the PSUB 111 typically includes other devices or structures formed therein. For example, any of the circuitry of the chip interfaces herein can be fabricated on a common substrate of a semiconductor die.

A gated diode can include various wells (for instance, n-type well (NW) and/or p-type well (PW) regions), various active regions (for instance, n-type active (N+) and/or p-type active (P+) regions), gate structures (for instance, metal gates), and/or other structures. As persons of ordinary skill in the art will appreciate, P+ regions have a higher doping concentration than the PWs, which in turn have a higher doping concentration than the p-type substrate. Additionally, N+ regions have a higher doping concentration than NWs. Persons having ordinary skill in the art will appreciate various concentrations of dopants in the regions.

It should be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries as shown in the figures of this type and are illustrated as abrupt structures merely for the assistance of the reader. As persons having ordinary skill in the art will appreciate, p-type regions can include a p-type semiconductor material, such as boron, as a dopant. Furthermore, n-type regions can include an n-type semiconductor material, such as phosphorous, as a dopant.

Although electrical connections are illustrated schematically using lines, persons having ordinary skill in the art will appreciate that the annotated electrical connections can be made in part using metallization via back-end processing. Moreover, in certain implementations, bond pads or other structures can be included, and can correspond to certain nodes. Such details are omitted for clarity of the figures.

As shown in FIG. 3C, the gated diode 130 includes an anode terminal (ANODE) and a cathode terminal (CATHODE). Additionally a substrate terminal (SUB) for connecting to the PSUB 111 is depicted.

Figure 3D:
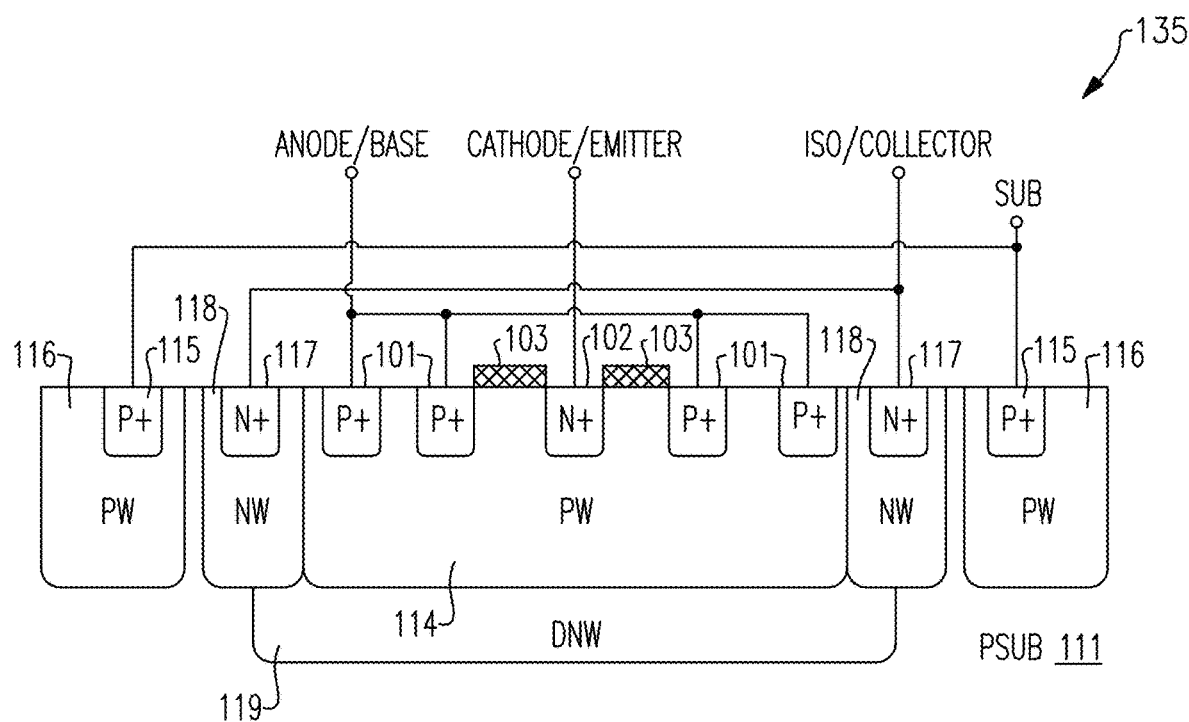
FIG. 3D is a cross section of a gated diode according to another embodiment.

FIG. 3D is a cross section of a gated diode 135 according to another embodiment. The gated diode 135 is formed in the PSUB 111, and includes P+ anode regions 101, N+ cathode region 102, metal gates 103, PW 114, P+ guard ring 115, PW guard ring 116, N+ isolation ring 117, NW isolation ring 118, and DNW 119. The N+ isolation ring 117, NW isolation ring 118, and DNW 119 operate as an n-type isolation tub that electrically isolates the PW 114 from the PSUB 111. Additionally, the P+ guard ring 115 and the PW guard ring 116 operate as a p-type guard ring.

In the illustrated embodiment, the gated diode 135 is implemented using a bipolar transistor structure in which the base-emitter junction of the bipolar transistor structure serves as the gated diode. The gated diode 135 can provide lower capacitance, higher isolation, and/or lower reverse leakage current relative to the gated diode 130 of FIG. 3C.

Electrical connections are illustrated schematically above the cross-section using lines. As shown in FIG. 3D, the gated diode 135 includes an anode/base terminal (ANODE/BASE) and a cathode/emitter terminal (CATHODE/EMITTER). Additionally, an isolation/collector terminal (ISO/COLLECTOR) for connecting to the n-type isolation tub and a substrate terminal (SUB) for connecting to the PSUB 111/p-type guard ring are depicted.

FIGS. 3E-3K illustrate a plan view of gate and metallization layers for one embodiment of a gated diode. The plan views illustrate example chip metallization for a p-type gated diode in accordance with the configuration FIG. 3D for a multi-finger implementation with forty-two metal gates.

Figure 3E:
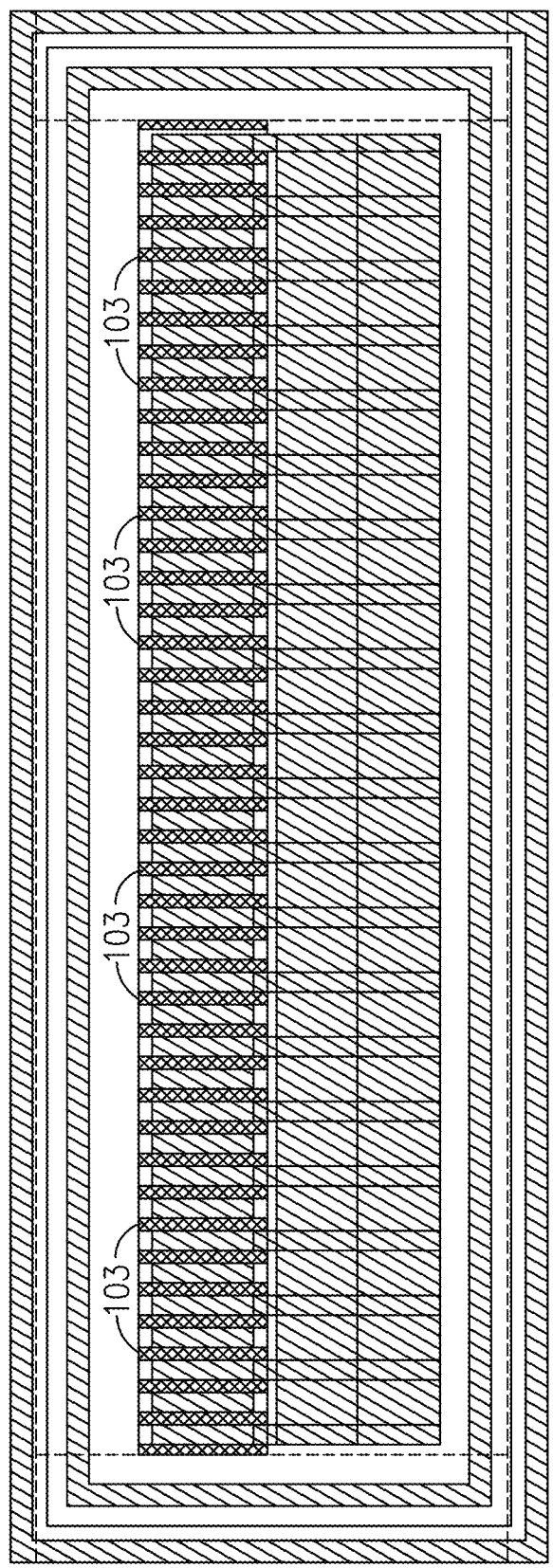
FIG. 3E is a plan view of one embodiment of a layout of gate and first metal layers for a gated diode.

FIG. 3E is a plan view of one embodiment of a layout of gate and first metal layers for a gated diode. As shown in FIG. 3E, the first metal layer is used for routing between fingers of the gated diode and to provide connectivity to the n-type isolation tub and p-type guard ring.

Figure 3F:
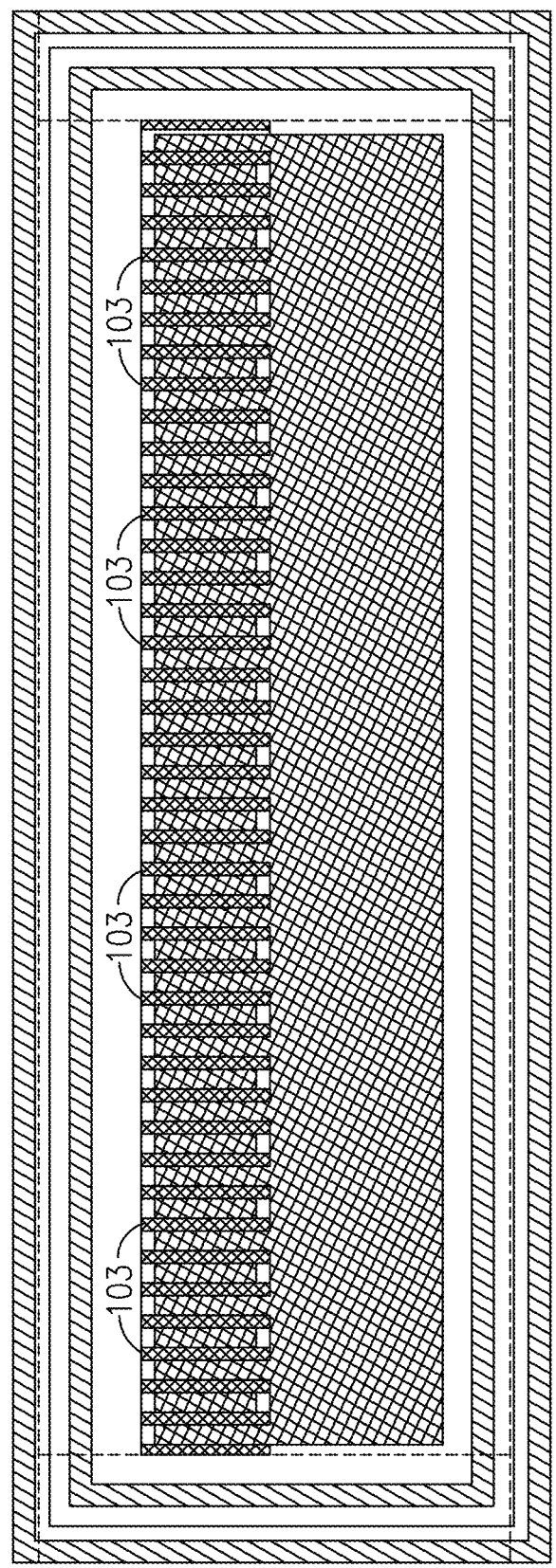
FIG. 3F is a plan view of one embodiment of a layout of gate, first metal, and second metal layers for a gated diode.

FIG. 3F is a plan view of one embodiment of a layout of gate, first metal, and second metal layers for a gated diode. As shown in FIG. 3F, the first metal layer and the second metal layer overlay the gated diode's fingers to provide enhanced transient current density handling capability.

Figure 3G:
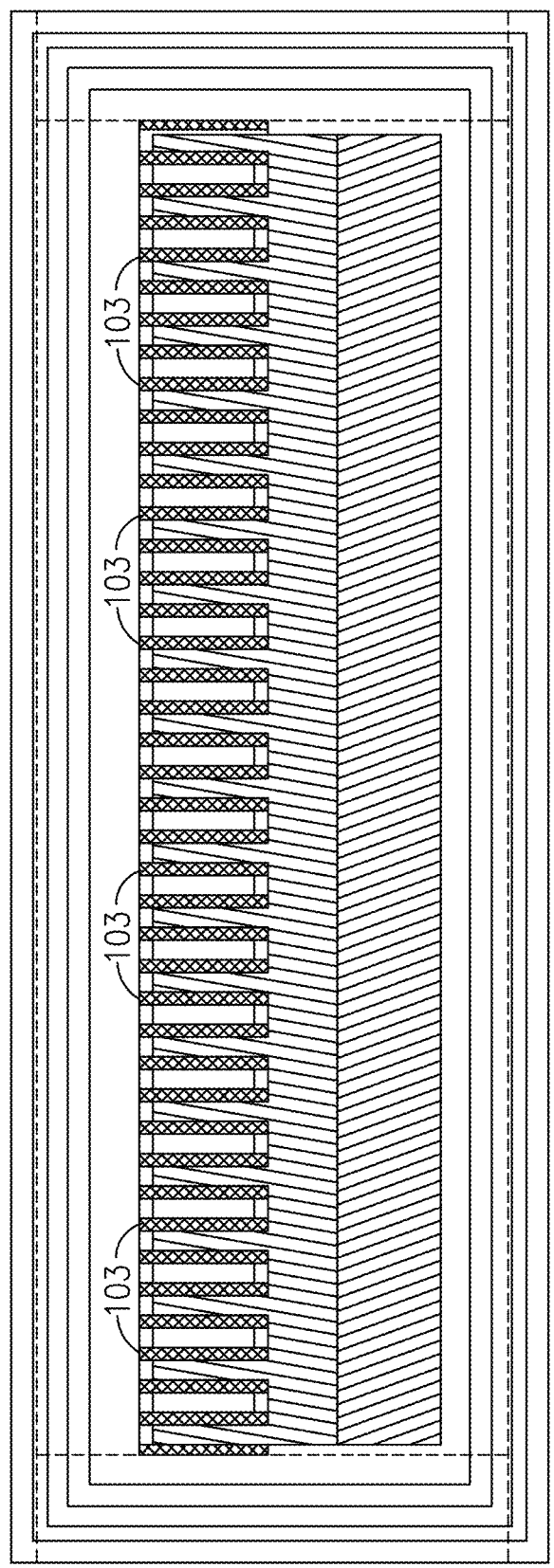
FIG. 3G is a plan view of one embodiment of a layout of gate, second metal, and third metal layers for a gated diode.

FIG. 3G is a plan view of one embodiment of a layout of gate, second metal, and third metal layers for a gated diode. As shown in FIG. 3G, the third metal layer provides low resistance for the anode terminal and cathode terminal while having relatively large separation to reduce inter-metal parasitic capacitances.

Figure 3H:
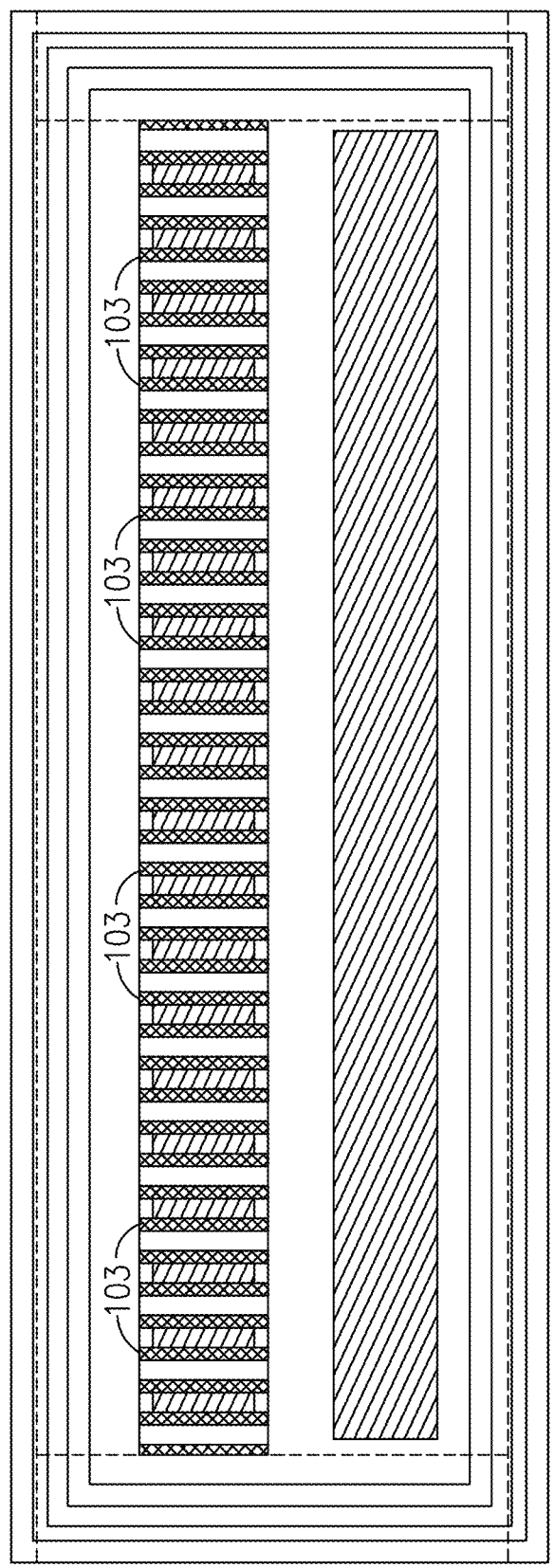
FIG. 3H is a plan view of one embodiment of a layout of gate, third metal, and fourth metal layers for a gated diode.

FIG. 3H is a plan view of one embodiment of a layout of gate, third metal, and fourth metal layers for a gated diode. As shown in FIG. 3H, the fourth metal layer overlaps the third metal layer to provide low terminal resistance and reduced inter-metal parasitic capacitances.

Figure 3I:
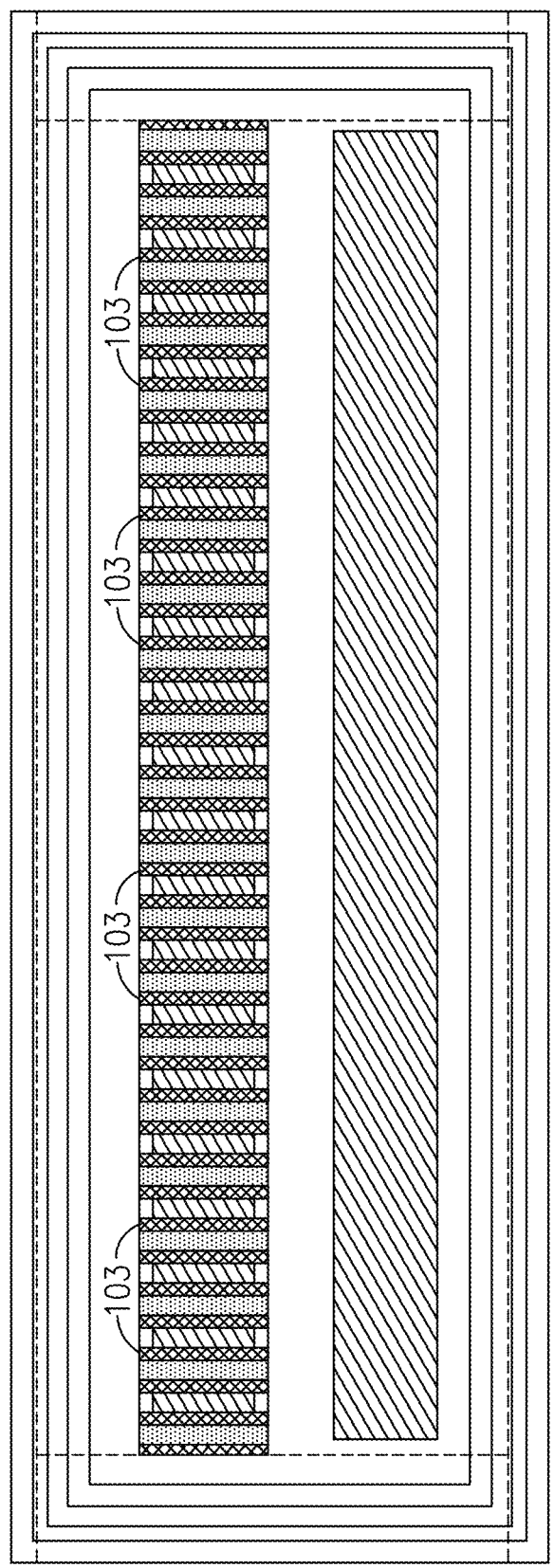
FIG. 3I is a plan view of one embodiment of a layout of gate, fourth metal, and fifth metal layers for a gated diode.

FIG. 3I is a plan view of one embodiment of a layout of gate, fourth metal, and fifth metal layers for a gated diode. As shown in FIG. 3I, the fifth metal layer overlaps the fourth metal layer to provide low terminal resistance and reduced inter-metal parasitic capacitances.

Figure 3J:
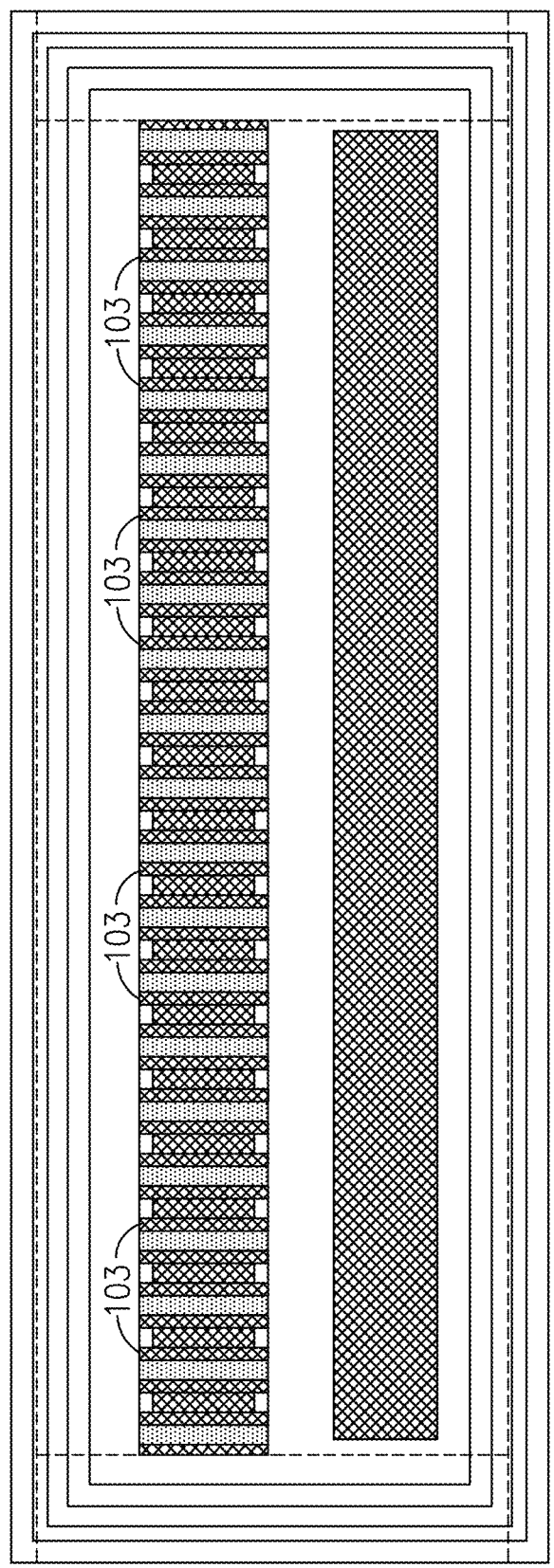
FIG. 3J is a plan view of one embodiment of a layout of gate, fifth metal, and sixth metal layers for a gated diode.

FIG. 3J is a plan view of one embodiment of a layout of gate, fifth metal, and sixth metal layers for a gated diode. As shown in FIG. 3J, the sixth metal layer overlaps the fifth metal layer to provide low terminal resistance and reduced inter-metal parasitic capacitances.

Figure 3K:
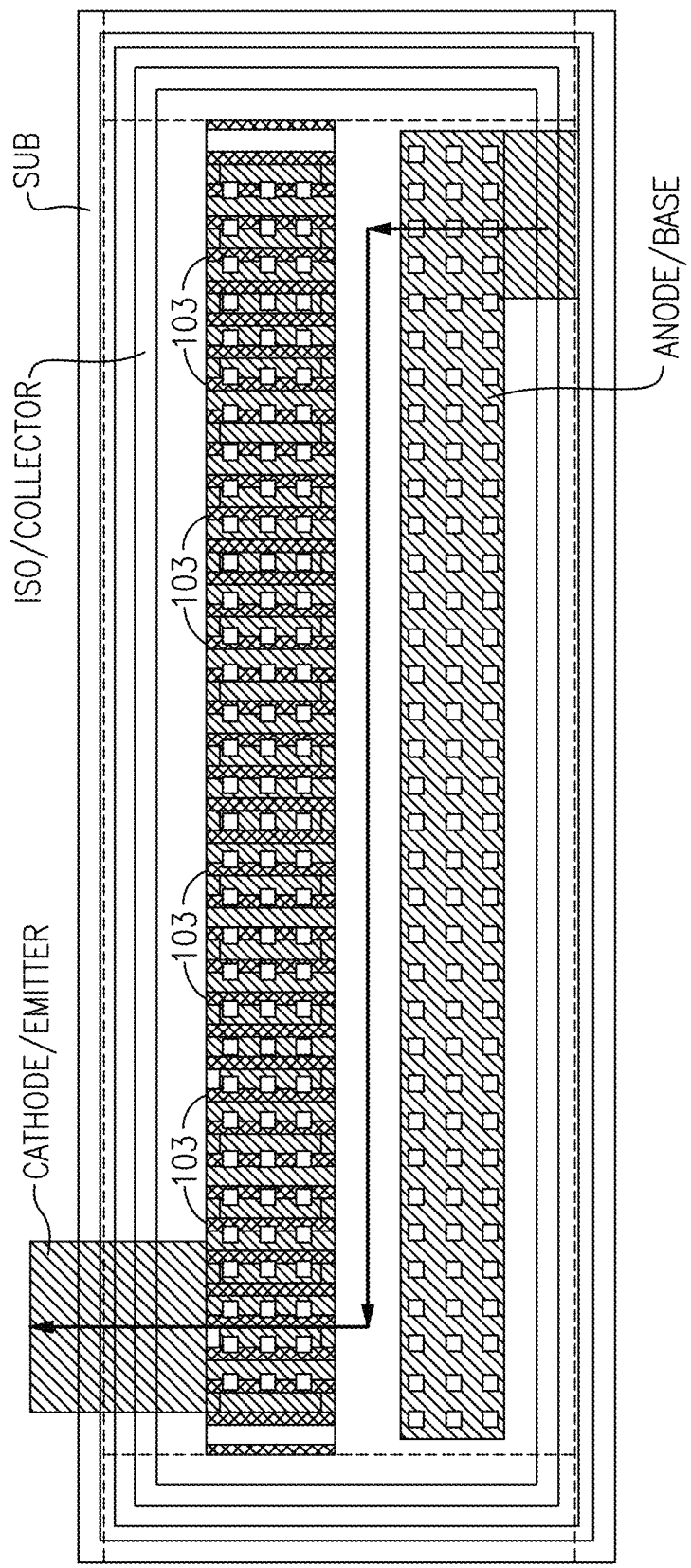
FIG. 3K is a plan view of one embodiment of a layout of gate, sixth metal, and seventh metal layers for a gated diode.

FIG. 3K is a plan view of one embodiment of a layout of gate, sixth metal, and seventh metal layers for a gated diode. As shown in FIG. 3K, the seventh metal layer serves to distribute current and to mitigation de-biasing effects by connecting to the anode and cathode terminals near opposite corners of the layout. Implementing the metallization in this manner aids in providing low capacitance, uniform current density, and/or low on-state resistance. As shown in FIG. 3K, a current path through the gated diode has been depicted.

Figure 4:
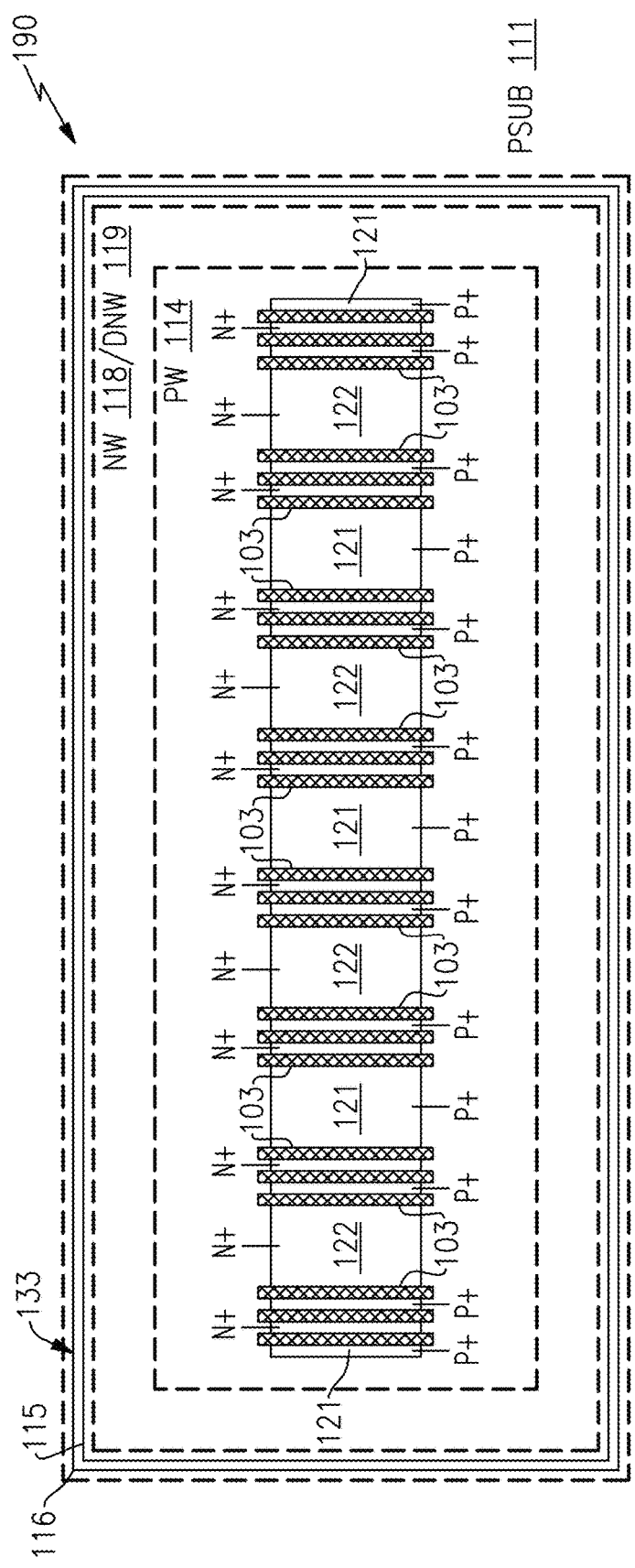
FIG. 4 is a plan view of one embodiment of a layout for reverse protection diodes.

FIG. 4 is a plan view of one embodiment of a layout for reverse protection diodes 190. The reverse protection diodes 190 are fabricated in the PSUB 111, and include P+ regions, N+ regions, metal gates 103, PW 114, NW 118, DNW 119, and a p-type guard ring 133.

The reverse protection diodes 190 illustrate one embodiment of reverse protection circuitry for an electrical interface in accordance with the teachings herein. For instance, reverse protection diodes 190 can be used to implement the first reverse protection diode 13 and the second reverse protection diode 14 of FIG. 2A. Although the reverse protection diodes 190 illustrate one example of suitable reverse protection circuitry for an electrical interface, other implementations of reverse protection circuitry can be used in accordance with the teachings herein.

The reverse protection diodes 190 includes a pair of series gated diodes present between P+ anode regions 121 and N+ cathode regions 122. The P+ anode regions 121 can be electrically connected to one another using metallization to form an anode terminal of a first gated diode. Additionally, the N+ cathode regions 122 can be electrically connected to one another using metallization to form a cathode terminal of a second gated diode. Moreover, metallization can be used to connect a cathode of the first gated diode to an anode of the second gated diode, thereby connecting the pair of gated diodes in series.

Thus, the layout of FIG. 4 includes two reverse protection gated diodes in series. Additionally, the layout includes multiple sections that operated in parallel with one another and that are connected to one another using metallization. As persons of ordinary skill in the art will appreciate, the layout of FIG. 4 further includes an SCR protection component.

The guard ring 133 can be implemented in a wide variety of ways. For example, the guard ring 133 can include a PW 134 and a P+ region 135 formed therein. In certain implementations, the P+ region 135 is electrically connected to ground.

Figure 5:
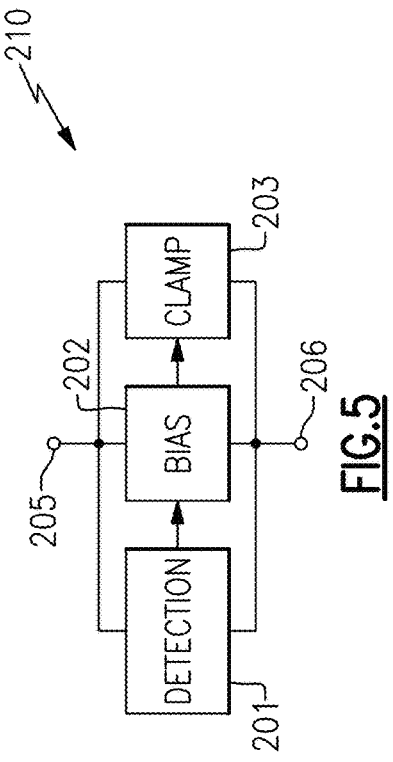
FIG. 5 is a schematic diagram of a power clamp according to one embodiment.

FIG. 5 is a schematic diagram of a power clamp 210 according to one embodiment. The power clamp 210 includes a detection circuit 201, a bias circuit 202, and a clamp 203, which are electrically connected in parallel between a first terminal 205 and a second terminal 206.

The power clamp 210 illustrates one embodiment of a power clamp for a chip interface implemented in accordance with the teachings herein. For example, the power clamp 210 illustrates one embodiment of the power clamp 9 of FIGS. 1A-1E and 13C and/or the power clamp 29 of FIG. 2A.

An actively-controlled power clamp is a type of power clamp that detects for the presence of an electrical overstress event by monitoring for electrical conditions associated with overstress. By implementing a power clamp with active control, relatively fast activation times, relatively low static power dissipation, and/or relatively compact area can be achieved relative to an implementation that relies on native junction breakdown to provide clamping.

The illustrated power clamp 210 is actively-controlled. For example, the detection circuit 201 activates a detection signal in response to detecting presence of an electrical overstress event between the first terminal 205 and the second terminal 206. For example, the detection circuit 201 can include a resistor-capacitor (RC) network that detects presence of electrical overstress based on monitoring a change in a voltage difference between the first terminal 205 and the second terminal 206 over time.

With continuing reference to FIG. 5, the bias circuit 202 biases the clamp 203 to control the clamp 203 between a high impedance or off state and a low impedance or on state. Additionally, the bias circuit 202 turns on the clamp 203 in response to activation of the detection signal, thereby turning on the clamp 203 when electrical overstress is detected.

Figure 6:
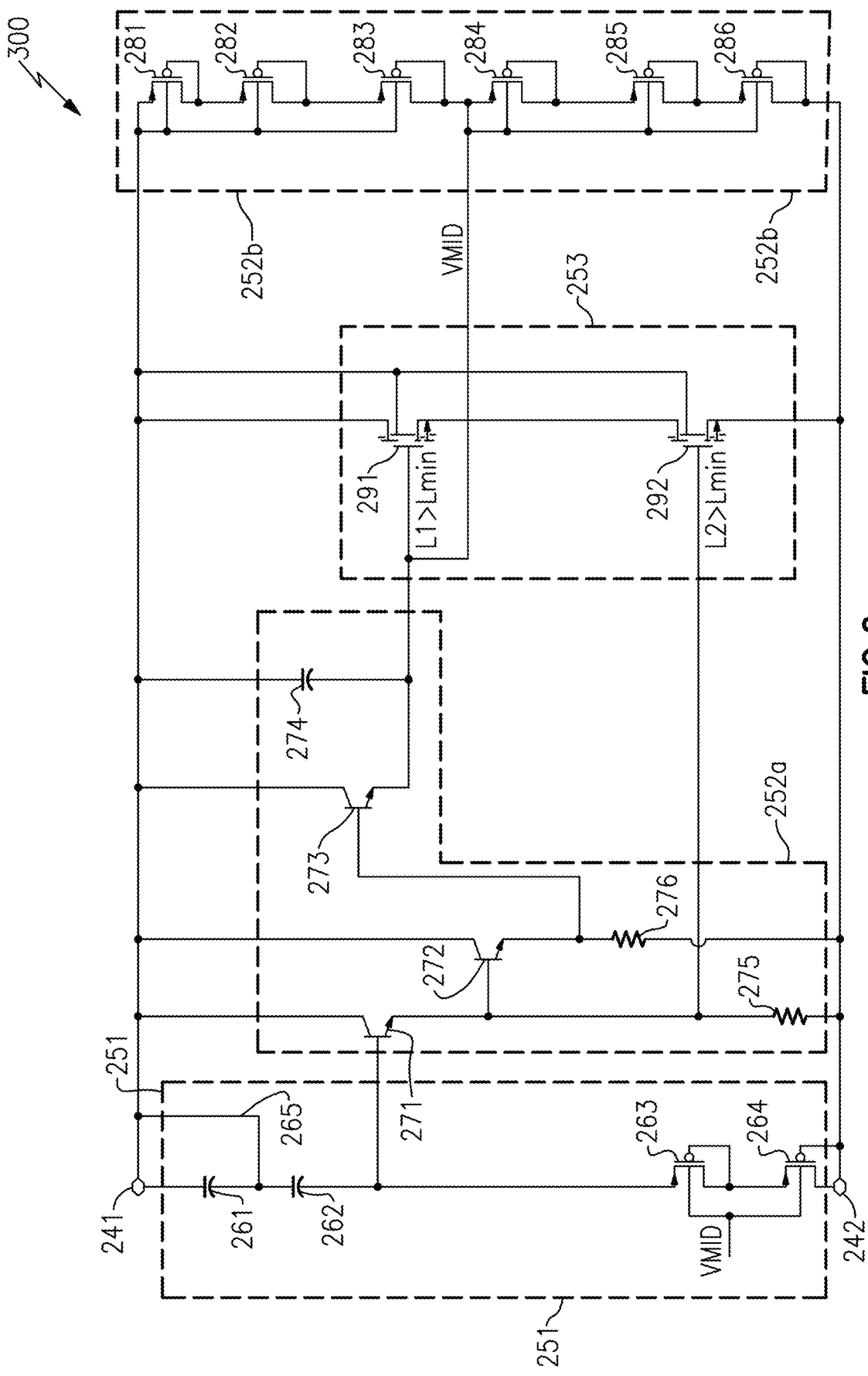
FIG. 6 is a schematic diagram of a power clamp according to another embodiment.

FIG. 6 is a schematic diagram of a power clamp 300 according to another embodiment. The power clamp 300 includes a detection circuit 251, a bias circuit, and a clamp 253. The bias circuit includes a first bias circuit portion 252a and a second bias circuit portion 252b, which are collectively referred to as the bias circuit 252a/252b. As shown in FIG. 6, the detection circuit 251, the bias circuit 252a/252b, and the clamp 253 are electrically connected in parallel with one another between a first terminal 241 and a second terminal 242.

Although one embodiment of an actively-controlled power clamp is depicted, the teachings herein are applicable to power clamps implemented in a wide variety of ways. For example, an actively-controlled power clamp can include a detection circuit, a bias circuit, and/or a clamp implemented in other ways.

In the illustrated embodiment, the detection circuit 251 includes a first capacitor 261, a second capacitor 262, a first diode-connected PFET 263, and a second diode-connected PFET 264. The first capacitor 261 can be bypassed using metallization 265 and/or the metallization 265 can be omitted to electrically connect the first capacitor 261 and the second capacitor 262 in series. As shown in FIG. 6, the bodies of the first diode-connected PFET 263 and the second diode-connected PFET 264 are biased by a mid voltage (VMID) from the second bias circuit portion 252b to extend operating voltage range and/or to prevent parasitic body diodes from inadvertently activing under certain bias conditions.

The first bias circuit portion 252a includes a first bipolar transistor 271, a second bipolar transistor 272, a third bipolar transistor 273, a capacitor 274, a first resistor 275, and a second resistor 276. The second bias circuit portion 252b includes a first diode-connected PFET 281, a second diode-connected PFET 282, a third diode-connected PFET 283, a fourth diode-connected PFET 284, a fifth diode-connected PFET 285, and a sixth diode-connected PFET 286.

The clamp 253 includes a first clamp NFET 291 and a second clamp NFET 292, in this embodiment. The clamp NFET 291 and the second clamp 292 are included in series to increase voltage handling capability, and in certain implementations have channel lengths greater than a minimum channel length ($L_{min}$) for the process technology to thereby lower leakage current. In one embodiment, a channel length $L_1$ of the first clamp NFET 291 is greater than $L_{min}$, and a channel length $L_2$ of the second clamp NFET 292 is greater than both $L_{min}$ and $L_1$. Thus, $L_2 > L_1 > L_{min}$, in this embodiment. In another embodiment, at least one of $L_2$ or $L_1$ is greater than $L_{min}$.

In embodiments in which the power clamp 300 is used to implement the power clamp 9 of FIGS. 1A-2A and/or 13C, the leakage current of the power clamp 300 can dominate the total leakage current of the pad 1. For example, during normal operation of the pad 1, a relatively small proportion of the pad's voltage appears across the isolation blocking voltage device(s) (for instance, the isolation diode 3), while a relatively large proportion of the pad's voltage appears across the power clamp.

To aid in reducing leakage current of a power clamp, such as the power clamp 300 of FIG. 6, the power clamp can be implemented with one or more features for reducing leakage current.

In a first example, the power clamp is implemented with stacked clamp devices (for instance, stacking the first clamp NFET 291 and the second clamp NFET 292).

In a second example, the power clamp is implemented with one or more clamp FETs having transistor lengths greater than a smallest channel length permitted by the manufacturing process. For example, with respect to the power clamp 300 of FIG. 6, the first clamp NFET 291 and/or the second clamp NFET 292 can be implemented with channel lengths greater than the minimum channel length. In one implementation, the first NFET 291 has a channel length in the range of 160 nm to 200 nm, for instance 170 nm, and a width in the range of 600 um to 800 um, for instance, 750 um (implemented using multiple parallel cells, such as 4). Additionally, in one implementation, the second NFET 292 has a channel length in the range of 200 nm to 500 nm, for instance 350 nm, and a width in the range of 600 um to 800 um, for instance, 750 um (implemented using multiple parallel cells, such as 4).

In a third example, bias circuitry used to bias a clamp device can be implemented to reduce leakage current. For example, with respect to the power clamp 300 of FIG. 6, the second bias circuit portion 252b can be implemented with channel lengths greater than the minimum channel length. In one implementation, the diode-connected PFETs 281-283 can have channel lengths in the range of 1.5 um 2.5 um, for instance 2 um, and device widths in the range of 250 nm to 500 nm, for instance, 300 nm, while the diode-connected PFETs 284-286 can have channel lengths in the range of 0.85 um to 1.5 um, for instance 1 um, and device widths in the range of 250 nm to 500 nm, for instance 300 nm.

In a fourth example, various capacitors of a power clamp can be implemented to provide coupling that can reduce size (and thus leakage current) of active devices. For example, with respect to the power clamp 300 of FIG. 6, in one implementation the capacitor 274 has a capacitance in the range of 400 fF to 500 fF, for instance, 450 fF, while the capacitor 261 and the capacitor 262 have capacitances in the range of 500 fF to 700 fF, for instance, 550 fF.

In a fifth example, a detection resistor is implemented as an active transistor with long channel length to reduce leakage current. For example, with respect to the power clamp 300 of FIG. 6, in one implementation the diode-connected PFETs 263-264 have channel lengths in the range of 1.5 um to 2.5 um, for instance, 2 um, and widths in the range of 250 nm to 500 nm, for instance, 300 nm.

In a sixth example, transistor areas of biasing devices used to amplify a detection signal are implemented with device areas selected to reduce leakage current. For example, with respect to the power clamp 300 of FIG. 6, in one implementation the bipolar transistors 271-273 are implemented with emitter areas in the range of 50 um² to 300 um², for instance, 100 um².

In a seventh example, resistors of a biasing circuit are implemented with relatively high resistance to reduce leakage current. For example, with respect to the power clamp 300 of FIG. 6, in one implementation the resistors 275-276 have a resistance of about 50 kilo Ohm or greater.

Figure 7:
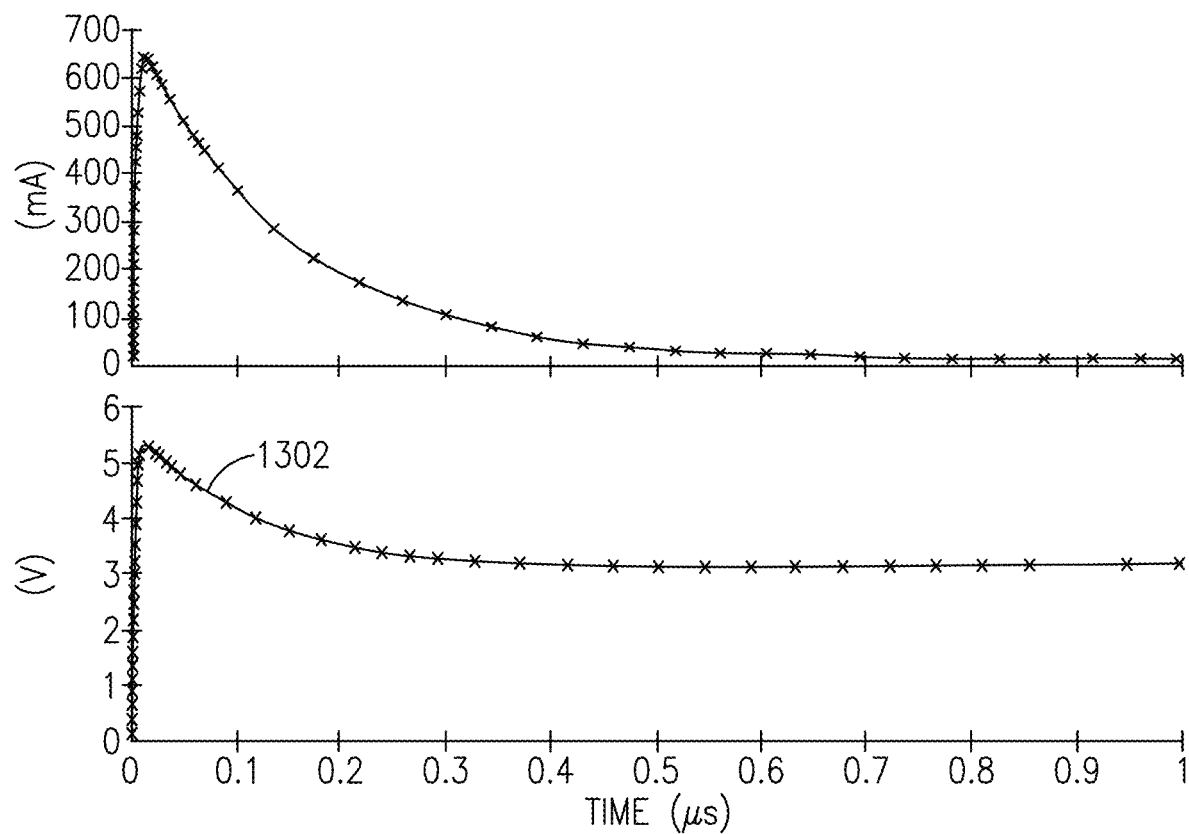
FIG. 7 is a graph of one example of a 1 kV human body model (HBM) time sweep simulation for the power clamp of FIG. 6.

FIG. 7 is a graph of one example of a 1 kV human body model (HBM) time sweep simulation for the power clamp 300 of FIG. 6. The graph includes an upper portion of current versus time, and a lower portion of voltage versus time. The voltage versus time simulation includes a plot 1302 of the voltage of the first terminal 241.

As shown in FIG. 7, the power clamp 300 limits peak current to less than 650 mA and peak voltage to less than 5.5 V, in this example.

Figure 8:
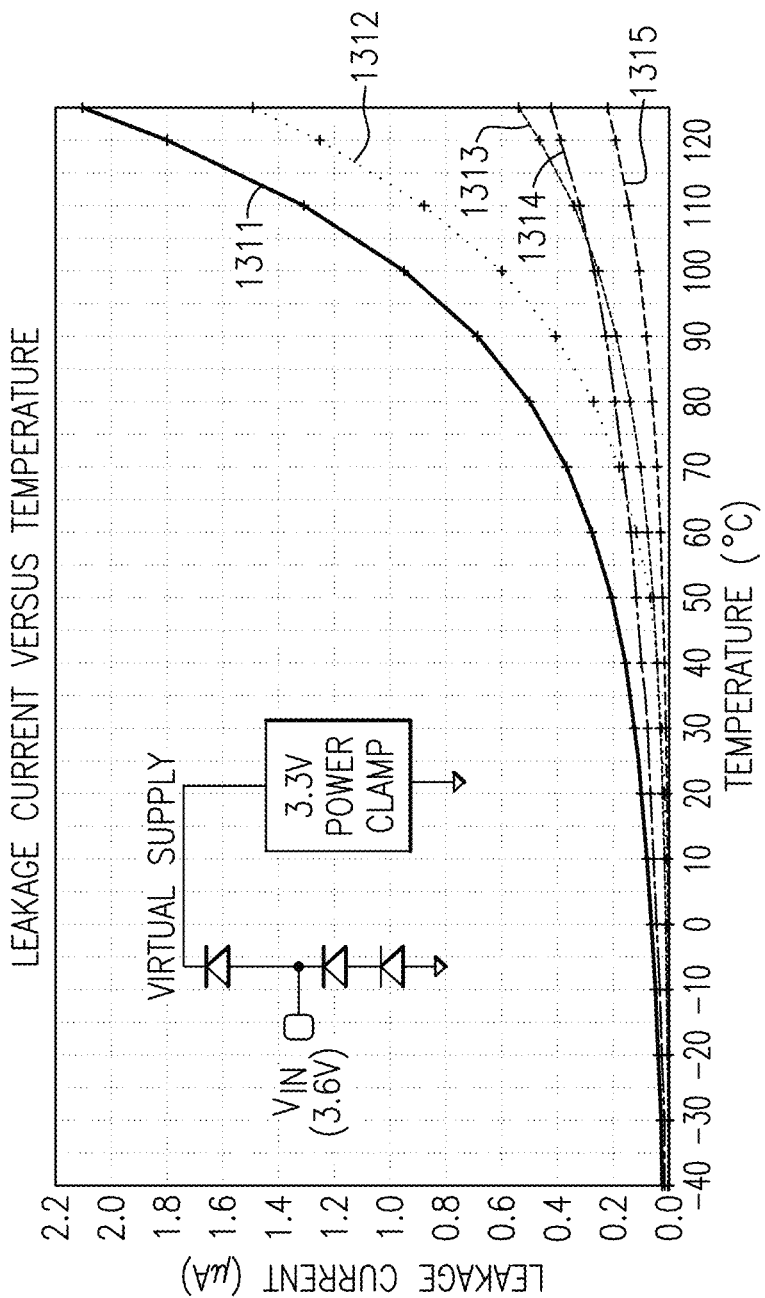
FIG. 8 is a graph of one example of leakage current versus temperature for one implementation of the chip interface of FIG. 2A.

FIG. 8 is a graph of one example of leakage current versus temperature for one implementation of the chip interface 50 of FIG. 2A operating with a signal pad input voltage of 3.6 V.

The graph includes plots for different simulation process corners, including fast N/fast P (FF) 1311, fast N/slow P (FS) 1312, nominal N/nominal P (TT) 1313, slow N/fast P 1314 (SF) 1314, and slow N/slow P (SS) 1315.

Figure 9:
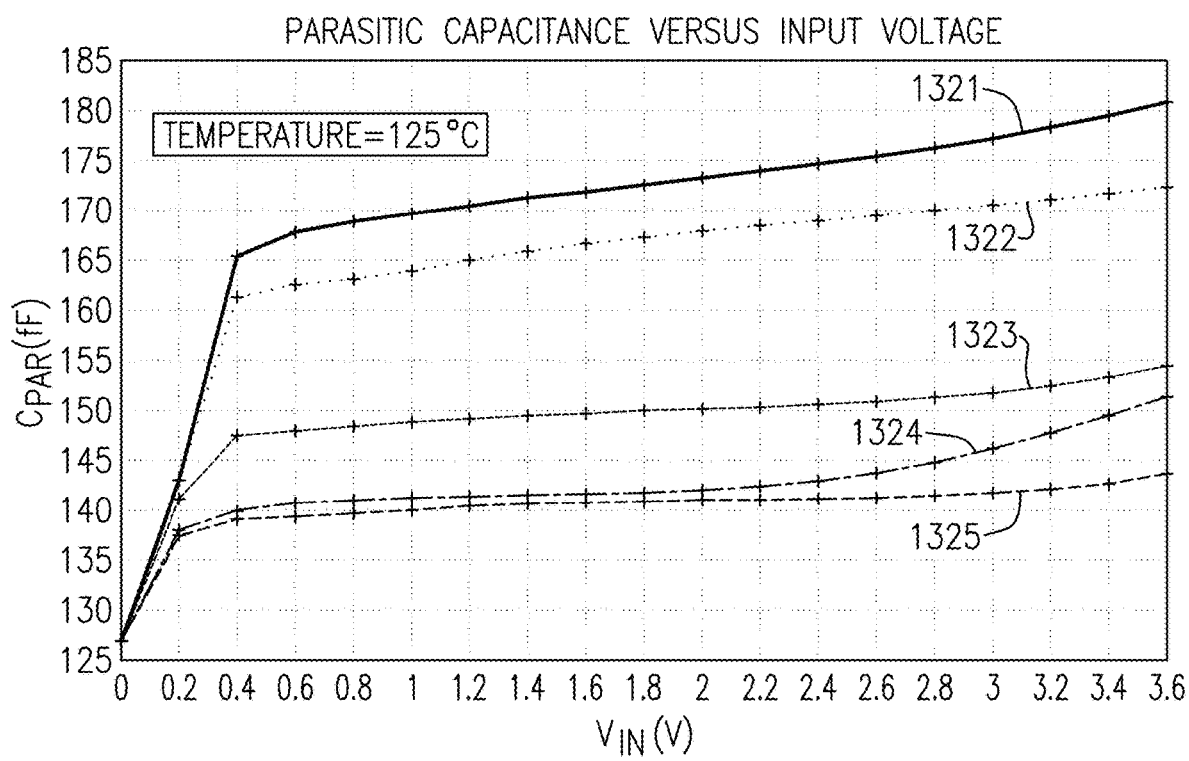
FIG. 9 is a graph of one example of parasitic capacitance versus temperature for one implementation of the chip interface of FIG. 2A.

FIG. 9 is a graph of one example of parasitic capacitance versus temperature for one implementation of the chip interface of FIG. 2A.

The graph includes plots for different simulation process corners, including FF 1321, FS 1322, TT 1323, SF 1324, and SS 1325.

Although FIGS. 7-9 illustrates various examples of simulation results for a protection circuit, other simulation results are possible, including results that depend on implementation, application, and/or processing technology.

Figure 10B:
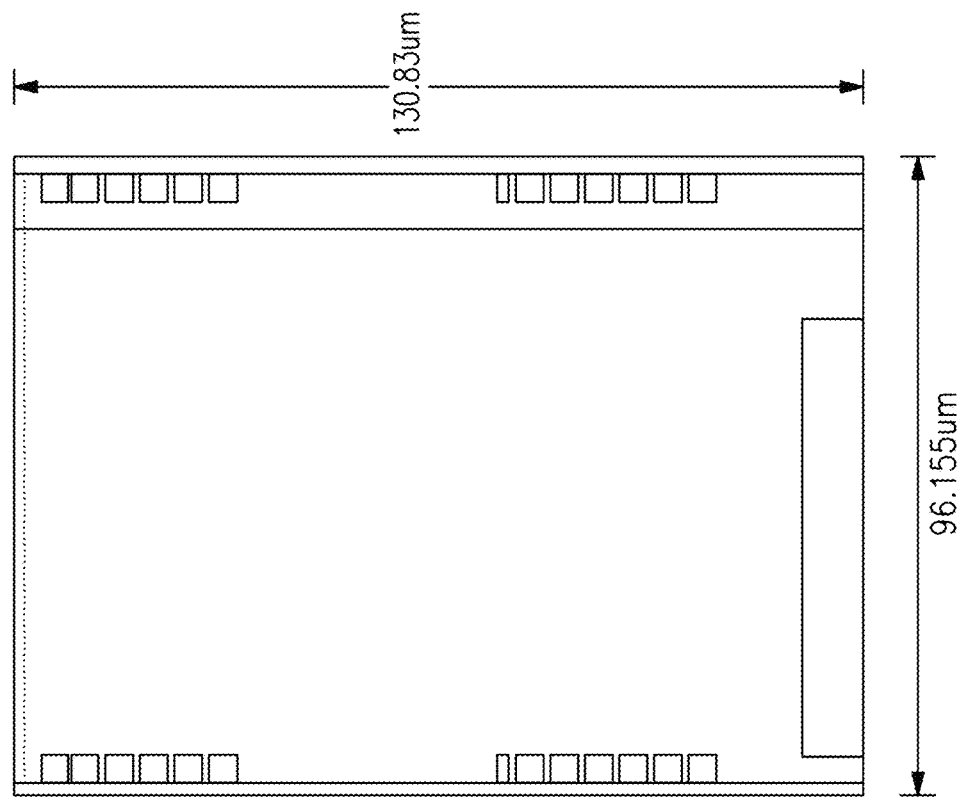
FIG. 10B is a plan view of another embodiment of a layout for a protection circuit.
Figure 10A:
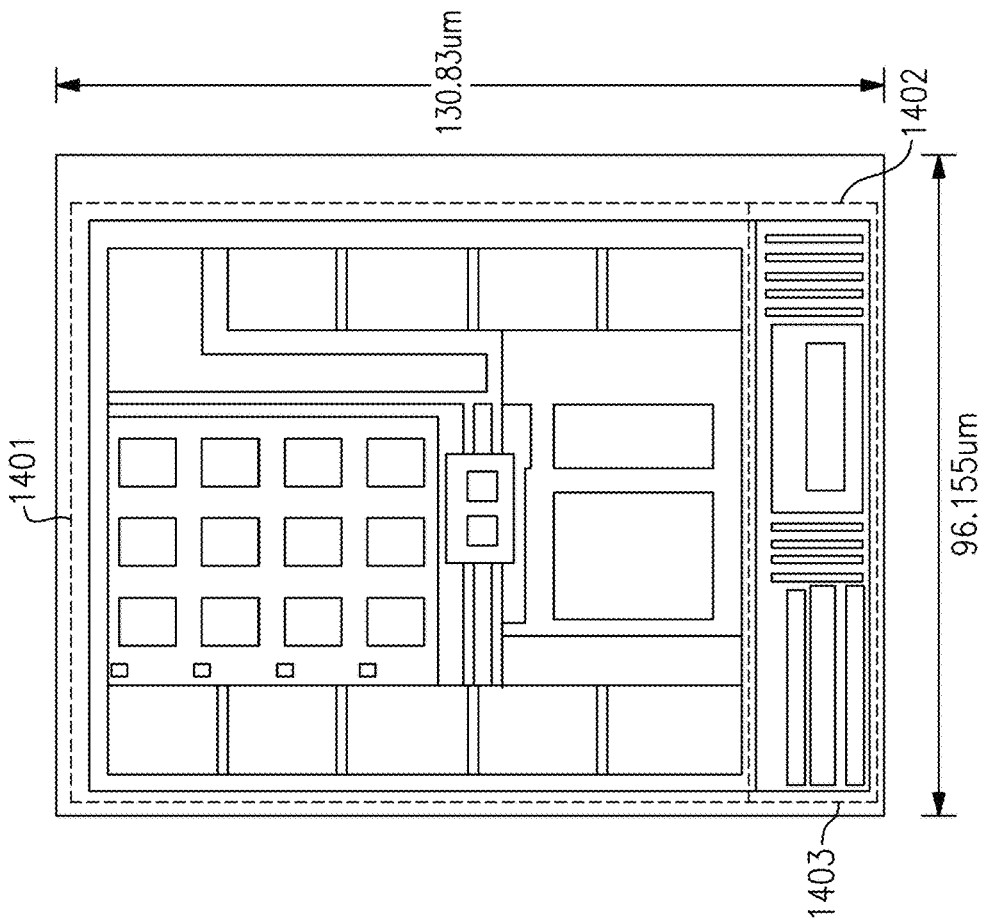
FIG. 10A is a plan view of one embodiment of a layout for a protection circuit.

FIG. 10A is a plan view of one embodiment of a layout for a protection circuit. The layout of FIG. 10A is implemented with a general positioning of the power clamp section, diode up section, and diodes down section as discussed above with reference to the layout 70 of FIG. 2B.

For example, the layout includes a low-leakage power clamp section 1401 (corresponding to a layout of the power clamp 29), an up diode section 1402 (corresponding to a layout of the isolation diode 3), and a diodes down section 1403 (corresponding to a layout of the first reverse protection diode 13 and the second reverse protection diode 14). In this example, the layout has a footprint of about 96 μm by 131 μm.

FIG. 10B is a plan view of another embodiment of a layout for a protection circuit. The layout of FIG. 10B is similar to the layout of FIG. 10A, except that upper metal layers of the layout are depicted in FIG. 10B and lower metal layers and doped semiconductor regions are omitted.

Figure 11:
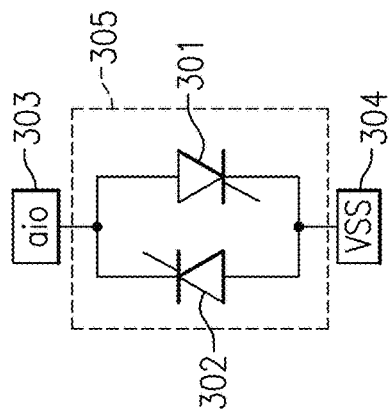
FIG. 11 is a schematic diagram of a bidirectional protection circuit according to one embodiment.

Bidirectional Protection Circuit with Forward Protection and Reverse Protection SCRs FIG. 11 is a schematic diagram of a bidirectional protection circuit 305 according to one embodiment. The bidirectional protection circuit 305 includes a forward protection SCR 301 and a reverse protection SCR 302. An SCR is also referred to as a thyristor. In the illustrated embodiment, the bidirectional protection circuit 305 is electrically connected between a first pad 303 (aio, in this example) and a second pad 304 (power low or VSS in this example).

As shown in FIG. 11, the forward protection SCR 301 includes an anode electrically connected to the first pad 303, and a cathode electrically connected to the second pad 304. Additionally, the reverse protection SCR 302 includes an anode electrically connected to the second pad 304, and a cathode electrically connected to the first pad 303. Thus, the forward protection SCR 301 and the reverse protection SCR 302 are electrically connected in anti-parallel with one another.

The forward protection SCR 301 activates to provide protection against positive polarity electrical overstress that causes the voltage of the first pad 303 to increase relative to the voltage of the second pad 304. The forward protection SCR 301 has a forward trigger voltage and a forward holding voltage that controls a forward protection characteristic of the bidirectional protection circuit 305.

With continuing reference to FIG. 11, the reverse protection SCR 302 activates to provide protection against negative polarity electrical overstress that causes the voltage of the first pad 303 to decrease relative to the voltage of the second pad 304. The reverse protection SCR 302 has a reverse trigger voltage and a reverse holding voltage that controls a reverse protection characteristic of the bidirectional protection circuit 305.

In certain implementations herein, the forward protection SCR 301 and the reverse protection SCR 302 are implemented in a common layout with a shared guard ring to enhance integration.

Figure 12:
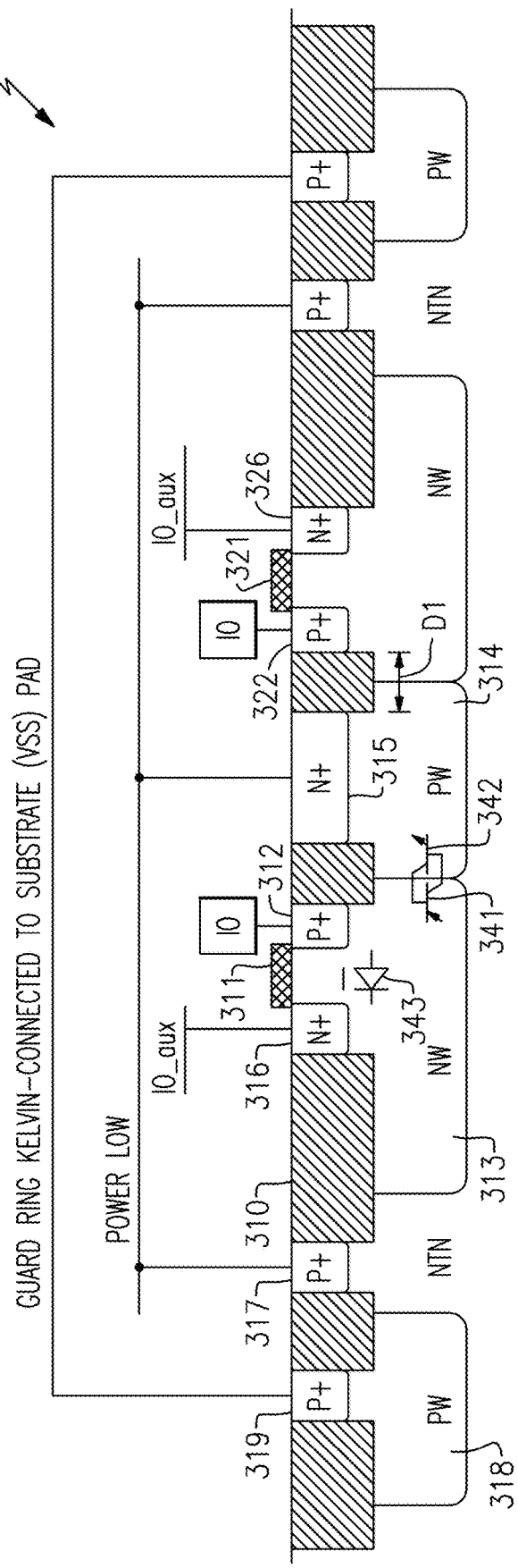
FIG. 12 is a cross section of a forward protection SCR according to one embodiment.

FIG. 12 is a cross section of a forward protection SCR 350 according to one embodiment. The forward protection SCR 350 illustrates one embodiment of the forward protection SCR 301 of FIG. 11.

In FIG. 12, a cross section of the forward protection SCR 350 is depicted. When viewed from above, the forward protection SCR 350 can have a layout implemented in a wide variety of ways, such as a planar layout configuration or annular configuration.

In the illustrated embodiment, the forward protection SCR 350 is formed directly in PSUB 306. However, the teachings herein are applicable to other configurations, such as implementations in which a substrate includes a p-type epitaxial layer over a doped or undoped support substrate, and the forward protection SCR 350 is fabricated in the p-type epitaxial layer. Although not illustrated in FIG. 12, the PSUB 306 typically includes other devices or structures formed therein. For example, a forward protection SCR, a reverse protection SCR, and an internal circuit protected by the SCRs can be fabricated in a common substrate.

The forward protection SCR 350 includes various NW and PW regions, such as NW 313, PW 314, and PW guard ring 318. Additionally, various N+ regions and P+ regions have been depicted, such as P+ anode regions 312/322, N+ cathode region 315, N+ auxiliary input/output (IO_aux) regions 316/326, first P+ ring region 317, and second P+ ring region 319. The P+ regions have a higher doping concentration than the PWs, which in turn have a higher doping concentration than the p-type substrate. Additionally, the N+ regions have a higher doping concentration than the NWs. Persons having ordinary skill in the art will appreciate various concentrations of dopants in the regions.

The forward protection SCR 350 further includes additional structures, including field plates or gates, such as metal gates 311/321. Additionally, isolation regions 310 (for instance, shallow trench isolation regions) have been depicted. The isolation regions 310 can be formed in a variety of ways, such as etching trenches in the p-type substrate, filling the trenches with a dielectric, such as silicon dioxide ($SiO_2$), and removing the excess dielectric using any suitable method, such as chemical-mechanical planarization.

It should be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries as shown in the figures of this type and are illustrated as abrupt structures merely for the assistance of the reader. As persons having ordinary skill in the art will appreciate, p-type regions can include a p-type semiconductor material, such as boron, as a dopant. Furthermore, n-type regions can include an n-type semiconductor material, such as phosphorous, as a dopant.

Although electrical connections are illustrated schematically using lines, persons having ordinary skill in the art will appreciate that the annotated electrical connections can be made in part using metallization via back-end processing. Moreover, in certain implementations, bond pads or other structures can be included, and can correspond to certain nodes, including, but not limited to, the signal input/output (TO), power low or VSS, substrate VSS, and/or IO_aux. Such details are omitted for clarity of the figures.

The forward protection SCR 350 has been schematically annotated to show certain electrical connections and devices, including a PNP bipolar transistor 341, an NPN bipolar transistor 342, and a gated diode 343. Although certain devices in a left-half of the forward protection SCR 350 have been annotated, persons having ordinary skill in the art will appreciate that the right-half can include similar devices that operate in combination with those on the left-half to achieve the overall operating characteristics of the forward protection SCR 350.

The PNP bipolar transistor 341 includes an emitter associated with P+ region 312, a base associated with NW 313, and a collector associated with PW 314. Additionally, the NPN bipolar transistor 342 includes an emitter associated with N+ region 315, a base associated with PW 314, and a collector associated with NW 313 and N+ region 316. Furthermore, the gated diode 343 includes an anode associated with P+ region 312 and a cathode associated with NW 313 and N+ region 316. As shown in FIG. 12, a metal gate 311 is formed over the NW 313 between the P+ region 312 and the N+ region 316.

In certain implementations, the P+ region 317 is implemented as a ring connected to a power low voltage via metallization. Additionally, a second ring (PW 318/P+ region 319) can be used for Kelvin connection. In the illustrated embodiment, P+ region 317 is formed in a native (NTN) region.

In certain implementations, a substrate can connect to a separate pad to enhance isolation and/or mitigate latch-up risk. In certain implementations, a VSS pad and SUB pad are connected to the same electrical potential using off-chip metallization.

In one embodiment, a spacing or distance D1 between the N+ region 315 and the P+ region 322 is selected to be in the range of about 0.2 μm and about 2 μm.

Figure 13A:
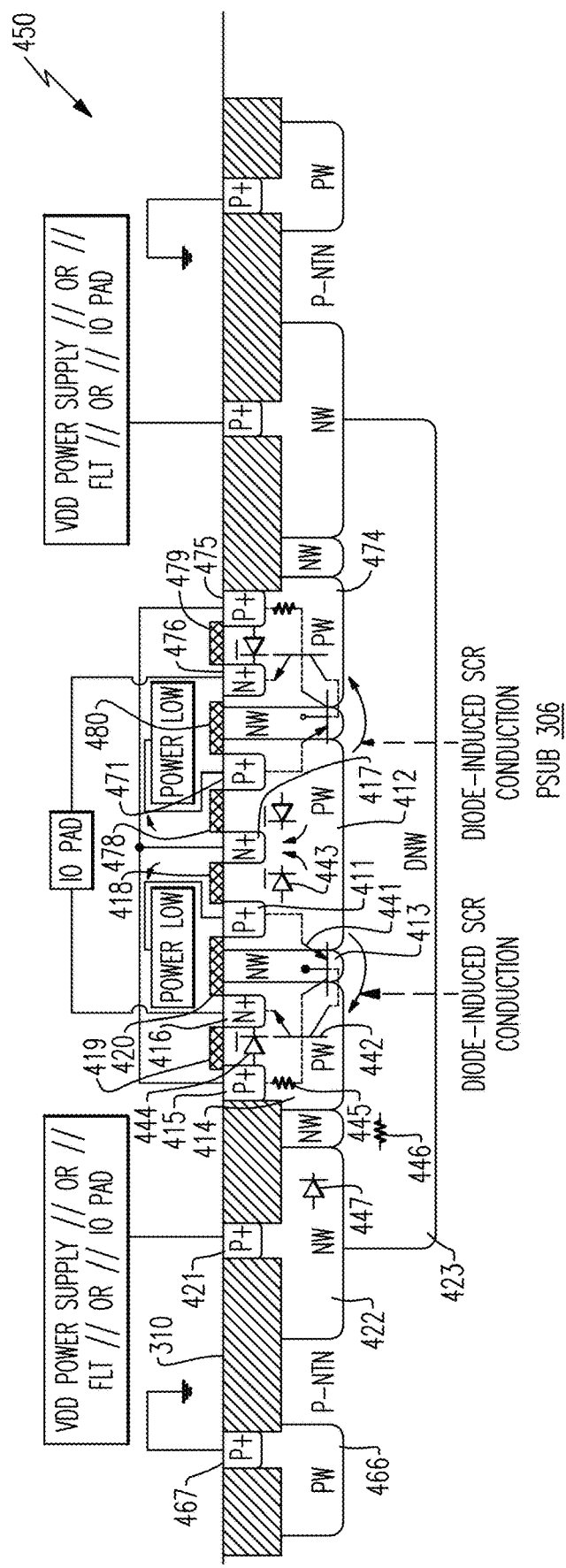
FIG. 13A is a cross section of a reverse protection SCR according to one embodiment.

FIG. 13A is a cross section of a reverse protection SCR 450 according to one embodiment. The reverse protection SCR 450 illustrates one embodiment of the reverse protection SCR 302 of FIG. 11.

The reverse protection SCR 450 is formed in the PSUB 306. The reverse protection SCR 450 includes various NW and PW regions, such as first PW 412, second PW 414, third PW 474, first NW 413, second NW 422, deep NW (DNW) 423, and PW guard ring 466. Additionally, various N+ regions and P+ regions have been depicted, such as P+ anode regions 411/471, N+ cathode region 416/476, N+ diode cathode region 417, P+ diode anode regions 415/475, P+ first ring region 421, and P+ second ring region 467. The reverse protection SCR 450 further includes gate regions 418/419/420/478/479/480.

The reverse protection SCR 450 has been schematically annotated to show certain electrical connections and devices, including a PNP bipolar transistor 441, an NPN bipolar transistor 442, a first gated diode 443, a second gated diode 444, a first resistor 445, a second resistor 446, and a diode 447. Persons having ordinary skill in the art will appreciate that the left-half and right-half of the reverse protection SCR 450 can include similar devices.

The PNP bipolar transistor 441 includes an emitter associated with P+ region 411 and PW 412, a base associated with NW 413, and a collector associated with PW 414 and P+ region 415. Additionally, the NPN bipolar transistor 442 includes an emitter associated with N+ region 416, a base associated with PW 414 and P+ region 415, and a collector associated with NW 413. Furthermore, the first gated diode 443 includes an anode associated with P+ region 411 and PW 412, a cathode associated with N+ region 417, and a metal gate 418. Additionally, the second gated diode 444 includes an anode associated with P+ region 415 and PW 414, a cathode associated with N+ region 416, and a metal gate 419. Furthermore, the diode 447 includes an anode associated with P+ region 421 and a cathode associated with NW 422 and deep NW 423. The first resistor 445 corresponds to a resistance of the PW 414, and the second resistor 446 corresponds to a resistance of the NW 422 and deep NW 423.

In the illustrated embodiment, the reverse protection SCR 450 includes the metal gate 420 extending over a boundary between the PW 414 and the NW 413 and over a boundary between the NW 413 and the PW 412.

The reverse protection SCR 450 includes gated diode-induced SCR conduction, and thus operates with enhanced performance characteristics, such as faster turn-on speed.

In one embodiment, the P+ region 421 is electrically connected to a power high supply voltage, such as a VDD pad. However, other implementations are possible, such as implementations in which the P+ region 421 is electrically connected to an IO pad or is electrically floating.

In certain implementations, the N+ regions 416/476 are electrically connected to an IO pad (for instance, aio pad 303 of FIG. 11), and the P+ regions 411/471 are electrically connected to one or more power low pads (for instance, VSS pad 304 of FIG. 11).

Figure 13B:
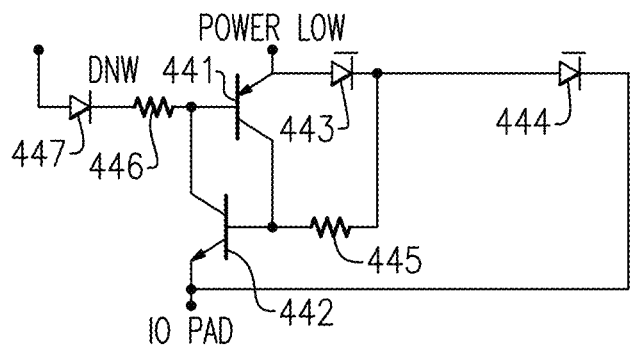
FIG. 13B is a circuit diagram of a portion of the reverse protection SCR of FIG. 13A.

FIG. 13B is a circuit diagram of a portion of the reverse protection SCR 450 of FIG. 13A. As shown in FIG. 13B, the circuit diagram includes the PNP bipolar transistor 441, the NPN bipolar transistor 442, the first gated diode 443, the second gated diode 444, the first resistor 445, the second resistor 446, and the diode 447.

The first gated diode 443 aids in providing diode-induced SCR conduction by injecting current into a base of the NPN bipolar transistor 442 in response to electrical overstress that decreases the voltage of the IO pad relative to the voltage of the power low pad.

In certain embodiments, a bidirectional protection circuit includes a forward protection SCR implemented in accordance with one or more features of FIG. 12 and/or a reverse protection SCR implemented in accordance with one or more features of FIGS. 13A-13B. Implementing the bidirectional protection circuit in this manner can provide a number of advantages.

In one example, such an embodiment can serve as a low trigger ground-reference ESD protection clamp for low capacitance, low leakage, and/or high voltage tolerance operation for signal pads (IOs), for instance, operating with nominal signaling of up to about 3.5 V. For instance, such a clamp can serve as a greater than 1.8 V and less than 6 V high voltage tolerant cell. Furthermore, the clamp includes a pair of SCRs that operate in parallel and that can be modeled as a single component. Such embodiments can include, for example, gated diodes with field plates implemented using metal transistor gates. Such clamps can be fabricated in a wide variety of fabrication technologies, including small transistor geometries processes, such as 28 nm processes.

Figure 13C:
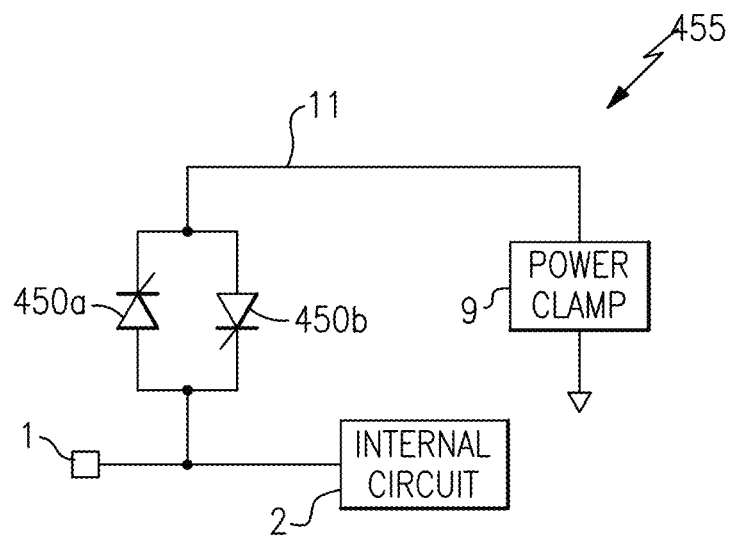
FIG. 13C is a schematic diagram of a chip interface according to another embodiment.

FIG. 13C is a schematic diagram of a chip interface 455 according to another embodiment. The chip interface 455 of FIG. 13C is similar to the chip interface 10 of FIG. 1A, except that the chip interface 455 omits the isolation diode 3 in favor of including a first isolation thyristor 450a and a second isolation thyristor 450b.

As shown in FIG. 13C, the first isolation thyristor 450a include an anode electrically connected to the pad 1 and a cathode electrically connected to the isolated node 11. Additionally, the second isolation thyristor 450b is electrically connected in anti-parallel with the first isolation thyristor 450a, and includes an anode electrically connected to the isolated node 11 and a cathode electrically connected to the pad 1.

In some implementations, the power clamp 9 can be configured to provide reverse conduction capability built-in as part of the power clamp configuration, such as by forming a dedicated p-n junction as a ring surrounding the power clamp and connected accordingly (for instance, to serve as a reverse protection p-n junction diode). This however can result in a large perimeter device and increase capacitance and leakage to a level that may not be suitable for some high-speed interface applications. Additionally or alternatively, in accordance with the teachings of FIGS. 1D and 1E, the power supply clamp can be configured to have a separate low capacitance diode (for instance, a p-n junction diode optimized for low capacitance for a given current handling capability) formed in parallel with the supply clamp for current conduction in reverse, not shown in this figure. This reverse conduction device can connect in parallel with the supply clamp. In one embodiment, the reverse conduction diode is implemented in accordance with the embodiments of FIG. 3C and/or FIG. 3D.

The teachings herein are applicable to a wide variety of types of isolation blocking voltage devices, including isolation diodes and/or isolation thyristors. For example, any of the embodiments herein (for instance, any of the chip interfaces of FIGS. 1A to 2A) can be implemented using one or more isolation diodes, one or more isolation thyristors, or any suitable combination thereof.

In one embodiment, the first isolation thyristor 450a and/or the second isolation thyristor 450b are implemented using the embodiment of FIGS. 13A and 13B. In such an embodiment, the connections of FIGS. 13A and 13B shown to the IO pad can be connected to the pad 1 of FIG. 13C, while the connections of FIGS. 13A and 13B shown to power low can instead be connected to the isolated node 11 of FIG. 13C. In this configuration, the two terminals of the embodiment in FIGS. 13A and 13B are arranged in antiparallel configuration. The inherent connection of the DNW diode 447 anode in each antiparallel thyristor embodiment (not shown in the figure) can be configured floating.

Figure 14A:
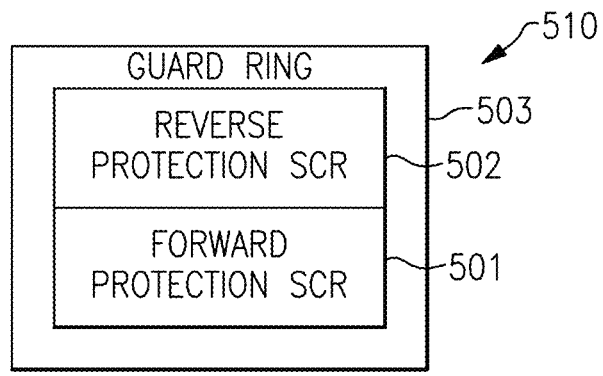
FIG. 14A is a plan view of one embodiment of a layout of a bidirectional protection circuit.

FIG. 14A is a plan view of one embodiment of a layout 510 of a bidirectional protection circuit. The layout 510 illustrates one embodiment of a layout for the bidirectional protection circuit 305 of FIG. 11.

The layout 510 includes a first section 501 corresponding to a layout of the forward protection SCR, a second section 502 corresponding to a layout of the reverse protection SCR, and a guard ring 503. In certain implementations, the layouts of the forward protection SCR and the reverse protection SCR are implemented such that currents flowing through the forward protection SCR are substantially orthogonal to currents flowing through the reverse protection SCR.

Thus, reverse protection current can substantially flow in one direction (for instance, along an x-axis), while forward protection current can substantially flow in another direction (for instance, along a y-axis). In one example, metals carrying current through the first section 501 are orthogonal to metals carrying current through the second section 502. In another example, layouts the metal gates in the first section 501 and the metal gates in the second section 502 are orthogonal to one another.

Figure 14B:
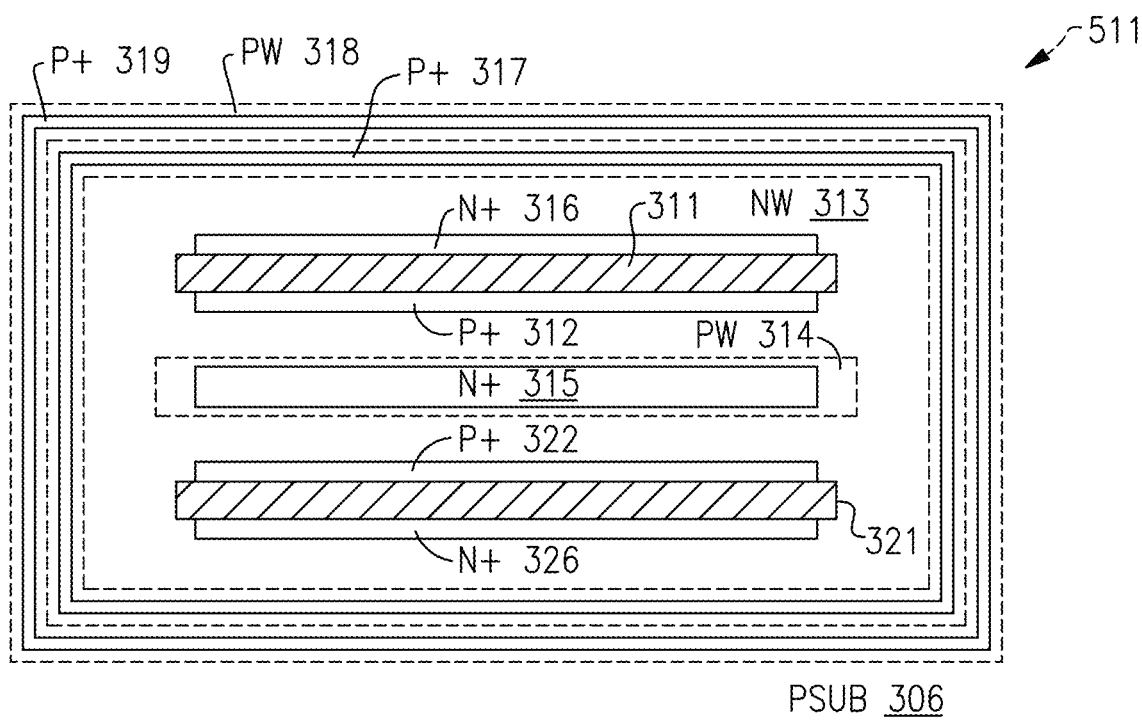
FIG. 14B is a plan view of one embodiment of a layout of a forward protection SCR.

FIG. 14B is a plan view of one embodiment of a layout 511 of a forward protection SCR. The layout 511 of FIG. 14B illustrates one embodiment of the plan view of the forward protection circuit 350 of FIG. 12. In one embodiment, the layout 511 is included in the first section 501 of the bidirectional protection circuit of FIG. 14A.

Figure 14C:
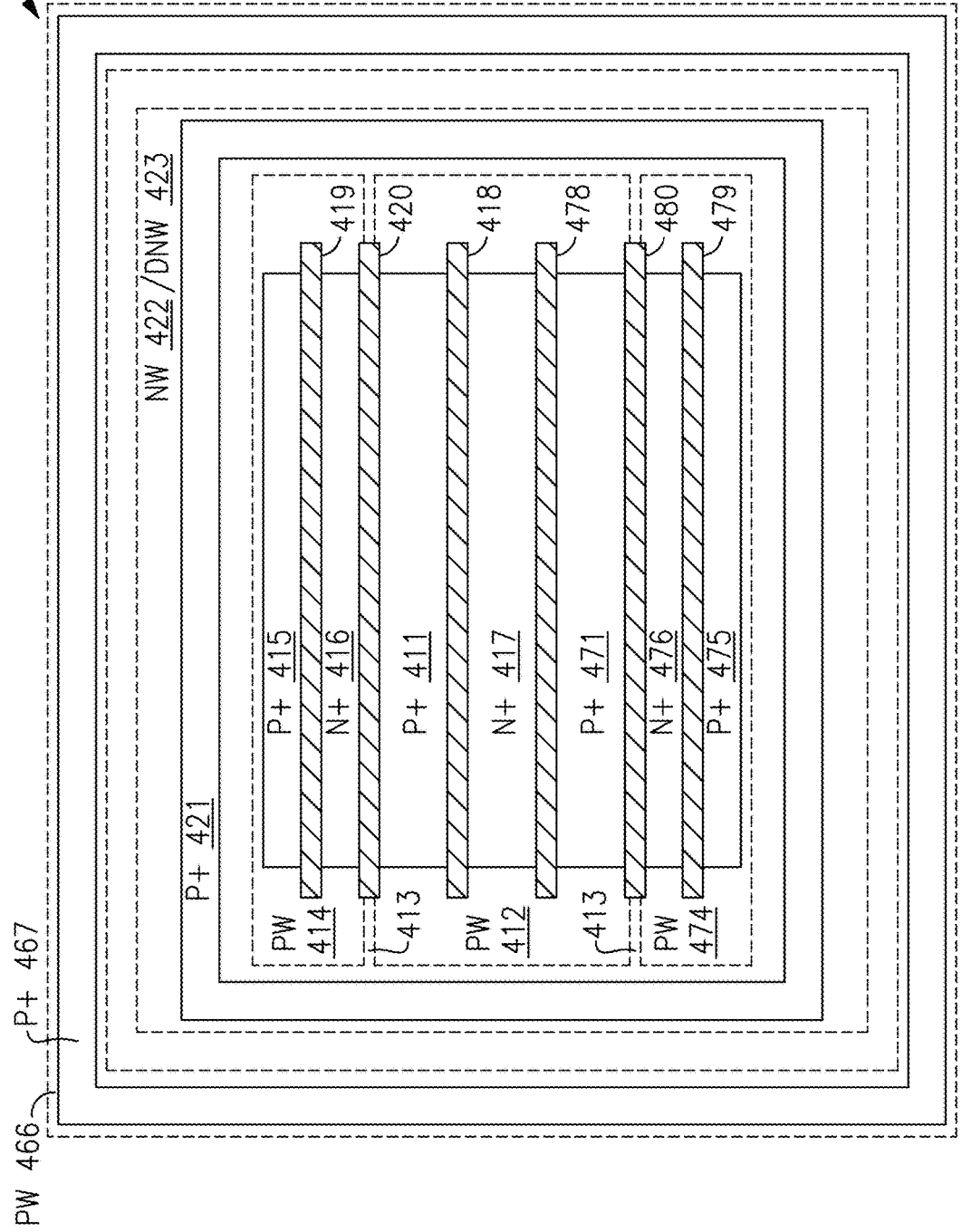
FIG. 14C is a plan view of another embodiment of a layout of a reverse protection SCR.

FIG. 14C is a plan view of another embodiment of a layout 512 of a reverse protection SCR. The layout 512 of FIG. 14C illustrates one embodiment of the plan view of the reverse protection circuit 450 of FIG. 13A. In one embodiment, the layout 512 is included in the second section 502 of the bidirectional protection circuit of FIG. 14A.

Figure 15A:
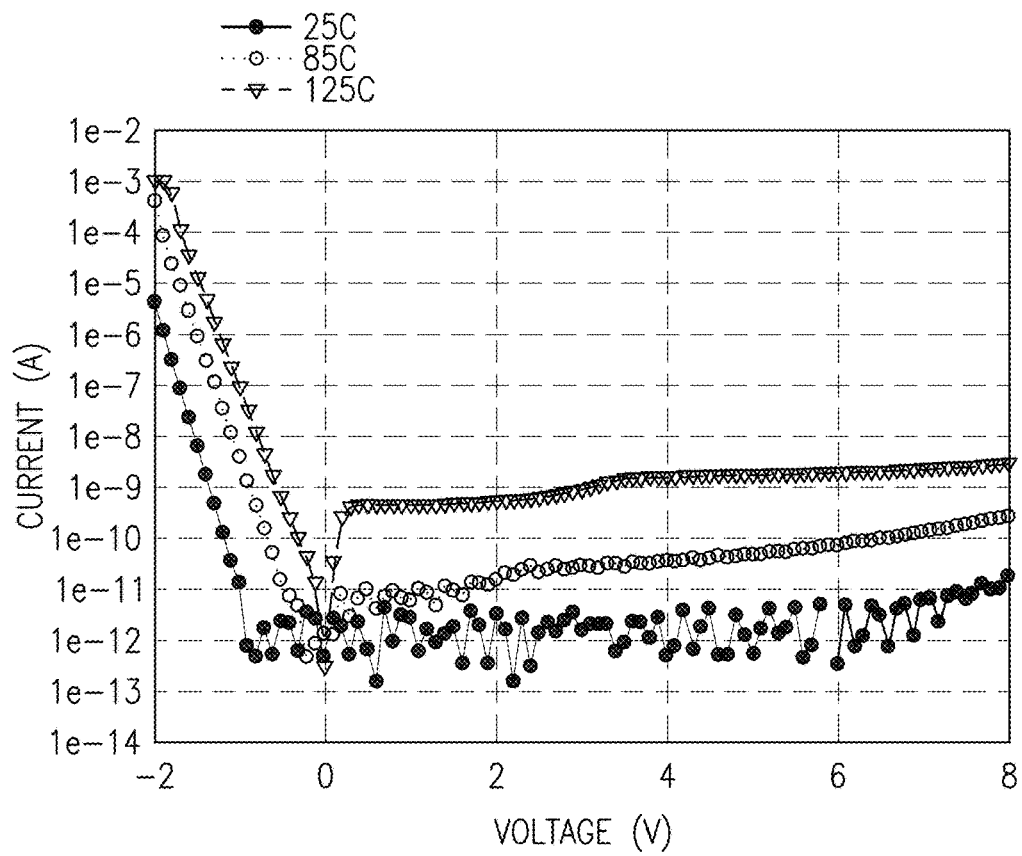
FIG. 15A is a graph of current versus voltage for different temperatures for one implementation of the bidirectional protection circuit of FIG. 11.

FIG. 15A is a graph of current versus voltage for different temperatures for one implementation of the bidirectional protection circuit 305 of FIG. 11. The graph corresponds to one example of 2.5 V SCR cell DC characteristics over temperature.

Figure 15B:
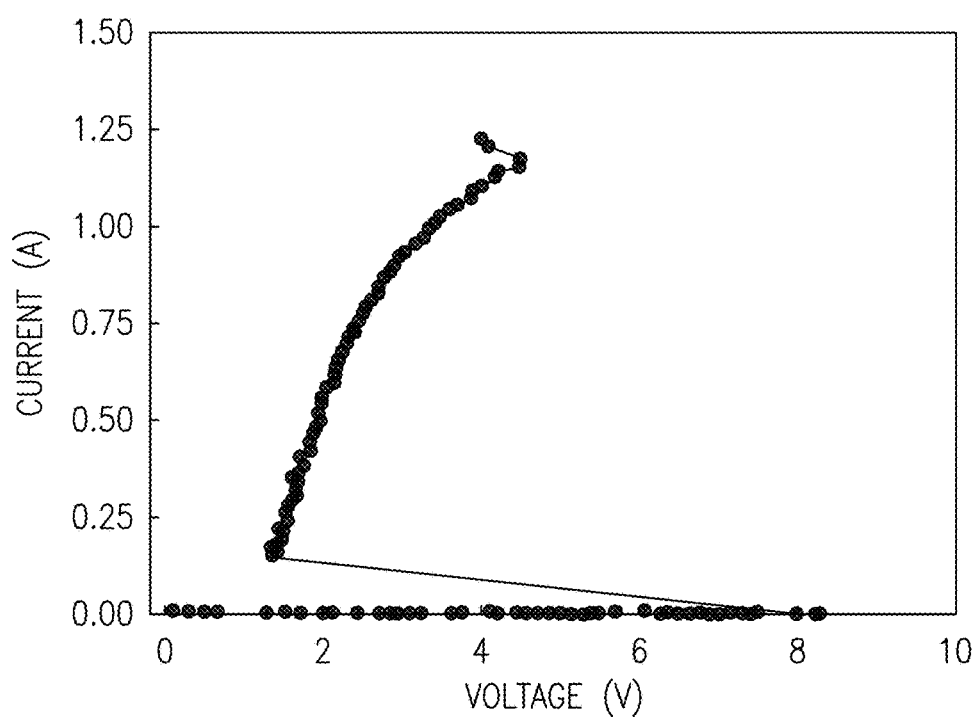
FIG. 15B is a graph of current versus voltage TLP characteristics for one implementation of the bidirectional protection circuit of FIG. 11.

FIG. 15B is a graph of current versus voltage TLP characteristics for one implementation of the bidirectional protection circuit of FIG. 11. The graph corresponds to one example of 2.5 V SCR cell TLP characteristics.

Figure 15C:
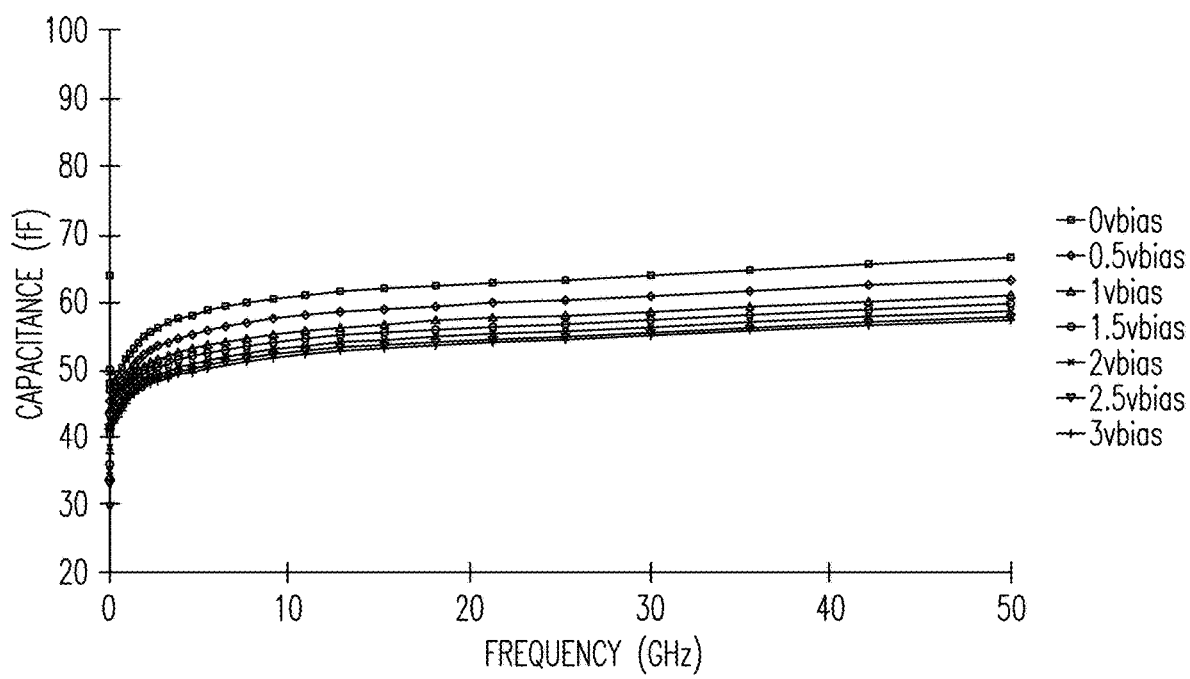
FIG. 15C is a graph of capacitance versus frequency characteristics for one implementation of the bidirectional protection circuit of FIG. 11.

FIG. 15C is a graph of capacitance versus frequency characteristics for one implementation of the bidirectional protection circuit of FIG. 11. The graph corresponds to one example of 2.5 V SCR cell C-V characteristics versus frequency. The graph includes plots for difference DC bias voltages across the bidirectional protection circuit.

Figure 15D:
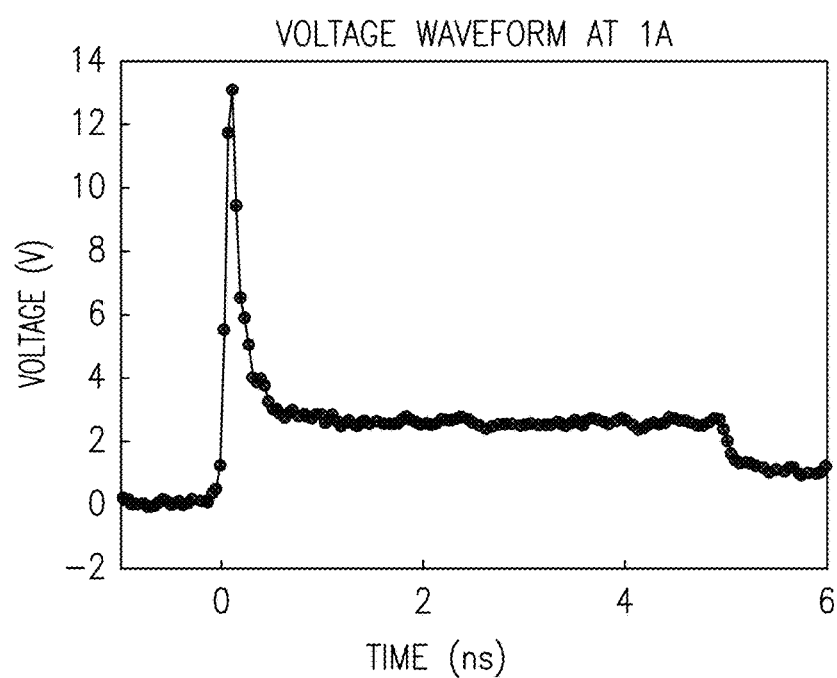
FIG. 15D is a graph of voltage versus time TLP characteristics for one implementation of the bidirectional protection circuit of FIG. 11.

FIG. 15D is a graph of voltage versus time TLP characteristics for one implementation of the bidirectional protection circuit 305 of FIG. 11. The graph corresponds to one example of 2.5 V SCR cell VFTLP characteristics at 1 A.

Although FIGS. 15A-15D illustrates one example of simulation results for a bidirectional protection circuit, other simulation results are possible, including results that depend on implementation, application, and/or processing technology.

Applications

Devices employing the above described schemes can be implemented into various electronic systems. Examples of the electronic systems can include, but are not limited to, consumer electronic products, parts of the consumer electronic products, electronic test equipment, communication infrastructure applications, etc. Further, the electronic systems can include unfinished products, including those for communication, industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A semiconductor die with bidirectional protection against electrical overstress, wherein the semiconductor die comprises:
    a first pad;
    a second pad;
    a forward protection silicon controlled rectifier (SCR) electrically connected between the first pad and the second pad and configured to activate in response to electrical overstress that increases a voltage of the first pad relative to a voltage of the second pad; and
    a reverse protection SCR electrically connected in parallel with the forward protection SCR between the first pad and the second pad and configured to activate in response to electrical overstress that decreases the voltage of the first pad relative to the voltage of the second pad,
    wherein a direction of current flow through the forward protection SCR is substantially perpendicular to a direction of current flow through the reverse protection SCR.

2. The semiconductor die of claim 1, wherein the forward protection SCR comprises at least one gated diode.

3. The semiconductor die of claim 2, wherein the at least one gated diode comprises a semiconductor region, a p-type active (P+) anode region formed in the semiconductor region, an n-type active (N+) cathode region formed in the semiconductor region, and a metal gate over the semiconductor region between the P+ anode region and the N+ cathode region.

4. The semiconductor die of claim 1, wherein the reverse protection SCR comprises at least one gated diode.

5. The semiconductor die of claim 4, wherein the at least one gated diode comprises a semiconductor region, a p-type active (P+) anode region formed in the semiconductor region, an n-type active (N+) cathode region formed in the semiconductor region, and a metal gate over the semiconductor region between the P+ anode region and the N+ cathode region.

6. The semiconductor die of claim 1, wherein the reverse protection SCR comprises a first terminal, a second terminal, a PNP bipolar transistor and an NPN bipolar transistor that are cross-coupled between the first and second terminal.

7. The semiconductor die of claim 6, wherein the reverse protection SCR further comprises a gated diode and a resistor in series between an emitter of the PNP bipolar transistor and a base of the NPN bipolar transistor.

8. The semiconductor die of claim 6, wherein the reverse protection SCR further comprises a first gated diode and a second gated diode in series between an emitter of the PNP bipolar transistor and an emitter of the NPN bipolar transistor.

9. The semiconductor die of claim 6, wherein the reverse protection SCR further comprises a first p-type well (PW) region, a second PW region, and an n-type well (NW) region between the first PW region and the second PW region, wherein an emitter, a base, and a collector of the PNP bipolar transistor correspond to the first PW region, the NW region, and the second PW region, respectively.

10. The semiconductor die of claim 6, wherein the reverse protection SCR further comprises a deep well isolation region formed in a substrate and a plurality of regions connected to the first terminal and the second terminal, wherein each of the plurality of regions of the reverse protection SCR are decoupled and isolated from the substrate.

11. The semiconductor die of claim 10 wherein the reverse protection SCR further comprises a third terminal connected to an active P+ region that is formed in the deep well isolation region, wherein the third terminal is operable to provide forward bias definition for the deep well isolation region while preventing reverse current conduction through the deep well isolation region when a voltage of the third terminal is pulled-down below that of the first terminal and the second terminal.

12. The semiconductor die of claim 9, wherein the reverse protection SCR further comprises a metal gate extending over a boundary between the first PW region and the NW region and over a boundary between the NW region and the second PW region.

13. A method of bidirectional protection against electrical overstress, the method comprising:
    activating a forward protection silicon controlled rectifier (SCR) in response to electrical overstress that increases a voltage of a first pad relative to a voltage of a second pad, the forward protection SCR electrically connected between the first pad and the second pad; and
    activating a reverse protection SCR in response to electrical overstress that decreases the voltage of the first pad relative to the voltage of the second pad, the reverse protection SCR electrically connected in parallel with the forward protection SCR between the first pad and the second pad, wherein a direction of current flow through the forward protection SCR is substantially perpendicular to a direction of current flow through the reverse protection SCR.

14. The method of claim 13, wherein activating the forward protection SCR comprises conducting current through at least one gated diode.

15. The method of claim 14, wherein the at least one gated diode comprises a semiconductor region, a p-type active (P+) anode region formed in the semiconductor region, an n-type active (N+) cathode region formed in the semiconductor region, and a metal gate over the semiconductor region between the P+ anode region and the N+ cathode region.

16. The method of claim 13, wherein activating the reverse protection SCR comprises conducting current through at least one gated diode.

17. A bidirectional protection circuit for an electrical interface of a semiconductor die, the bidirectional protection circuit comprising:
a forward protection silicon controlled rectifier (SCR) including an anode connected to a first pad and a cathode connected to a second pad, the forward protection SCR configured to activate in response to electrical overstress that increases a voltage of the first pad relative to a voltage of the second pad; and
a reverse protection SCR including an anode connected to the second pad and a cathode connected to the first pad, the reverse protection SCR configured to activate in response to electrical overstress that decreases the voltage of the first pad relative to the voltage of the second pad,
wherein a direction of current flow through the forward protection SCR is substantially perpendicular to a direction of current flow through the reverse protection SCR.

18. The bidirectional protection circuit of claim 17, wherein the forward protection SCR comprises a first n-type well (NW) region, a first p-type active (P+) anode region formed in the first NW region, a first n-type active (N+) cathode region formed in the first NW region, and a first metal gate over the first NW region between the first P+ anode region and the first N+ cathode region.

19. The bidirectional protection circuit of claim 18, wherein the reverse protection SCR comprises a first p-type well (PW) region, a second P+ anode region formed in the first PW region, a second N+ cathode region formed in the first PW region, and a second metal gate over the first PW region between the second P+ anode region and the second N+ cathode region.

20. The bidirectional protection circuit of claim 19, wherein the reverse protection SCR further comprises a second PW region, a second NW region between the first PW region and the second PW region, and a third metal gate extending over a boundary between the first PW region and the second NW region and over a boundary between the second NW region and the second PW region.

* * * * *